(12) United States Patent
Umetani

(10) Patent No.: US 8,723,564 B2
(45) Date of Patent: May 13, 2014

(54) DRIVING CIRCUIT

(71) Applicant: DENSO CORPORATION, Kariya (JP)

(72) Inventor: Kazuhiro Umetani, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 13/768,255

(22) Filed: Feb. 15, 2013

(65) Prior Publication Data

US 2013/0214824 A1    Aug. 22, 2013

(30) Foreign Application Priority Data

Feb. 22, 2012 (JP) ................................. 2012-036188
Dec. 27, 2012 (JP) ................................. 2012-284933

(51) Int. Cl.
*H03K 3/00* (2006.01)

(52) U.S. Cl.
USPC .......................................................... 327/109

(58) Field of Classification Search
CPC .............................................. H03K 17/04126
USPC .......................................................... 327/109
See application file for complete search history.

(56) References Cited

U.S. PATENT DOCUMENTS 8,040,162 B2 * 10/2011 Miyazaki ...................... 327/108
2009/0033377 A1    2/2009 Hashimoto et al.

OTHER PUBLICATIONS

K.I. Hwu and Y.T. Yau. "A Novel Gate Driver with Positive and Negative Output Voltages." The 33rd Annual Conference of the IEEE Industrial Electronics Society (IECON). Nov. 5-8, 2007. Taipei, Taiwan.

* cited by examiner

*Primary Examiner* — Daniel Rojas
(74) *Attorney, Agent, or Firm* — Posz Law Group, PLC

(57) ABSTRACT

A driving circuit that drives a semiconductor device includes first to sixth semiconductor devices. A first state and a second state are provided in one cycle in which a voltage is applied to a control terminal of the semiconductor device. In the first state, the first semiconductor device is closed, the third and fourth semiconductor devices are opened, and when the second semiconductor device is structured to have a semiconductor switch, the semiconductor switch is closed. In the second state, the first semiconductor device is opened, and the third and fourth semiconductor devices are closed.

15 Claims, 27 Drawing Sheets

DRIVING CIRCUIT

CROSS REFERENCE TO RELATED APPLICATIONS

The present application is based on and claims priority to Japanese Patent Application No. 2012-36188 filed on Feb. 22, 2012 and No. 2012-284933 filed on Dec. 27, 2012, the contents of which are incorporated in their entirety herein by reference.

TECHNICAL FIELD

The present disclosure relates to a driving circuit that drives a semiconductor device.

BACKGROUND

In recent years, with reduction of a supply voltage which is used, a threshold voltage of a semiconductor device also tends to be reduced. When the threshold voltage is reduced, malfunction due to noise is likely to occur. From such a situation, a driving circuit devise to reduce occurrence of the above malfunction is desired. As such a driving circuit, a driving circuit including two switches is widely known. In the driving circuit, when a semiconductor device is turned on, one switch is turned on to apply a positive voltage to the gate, and when the semiconductor device is turned off, the other switch is turned on to apply a negative voltage to the gate. In such a structure, a gate voltage at the turn-off is greatly far from a threshold potential. Therefore, even when the noise at switching and the like is superimposed on the gate, malfunction (erroneous on) due to that can be prevented.

However, in the above driving circuit, in addition to a power circuit that generates a positive power supply, a power circuit that generates a negative power supply is needed. Therefore, downsizing of the overall circuit is difficult, and the production cost increases. On the other hand, a driving circuit to generate a negative voltage by its own operation is disclosed in Japanese Patent No. 4682173 (corresponding to US 2009/0033377 A1 and called Patent Document 1). In the driving circuit of Patent Document 1, positive and negative voltages whose absolute values are each equal to a supply voltage can be applied from one driving power supply to the gate of semiconductor device.

However, the driving circuit of Patent Document 1 needs five switches (semiconductor switches). That is, compared with the above driving circuit having two switches, the number of switches greatly increases in the driving circuit of Patent Document 1. A relatively great current flows in the switches that form the driving circuit at a moment of switching. Therefore, as a switch used for the driving circuit, a capability (size) that can withstand such a current is needed. Therefore, increase of the number of switches used for the driving circuit causes problems such as increase of a circuit size and increase in cost. Particularly, since rapid switching needs charging and discharging of the gate in a short time, a great current flows in the driving circuit at an instant of switching, which makes the above problems remarkable.

Additionally, for the actual structure of a driving circuit, a short cut protection is necessary to stop the turn-on when a flow of a continuous short cut current is detected in the driving circuit. As a method of detecting a current (short-circuit current), a method of detecting a current based on a voltage drop of a shunt resistor, a method of detecting a current based on an amount of a voltage drop at a turn-on in a semiconductor switch, etc. are mentioned.

In the former method, for example, a resistor is inserted in series relative to a power supply terminal or a ground (GND) terminal, and a current value is detected based on a voltage drop due to the resistor. In such a method applied in the driving circuit, a current drive capacity at the on and off is restricted by the resistor. On the other hand, in the latter method, a voltage (for example, a voltage between a drain and source) of a semiconductor switch in which a short cut current may flow is monitored (detected), and it is determined that an excess current has flown (short cut) at a remarkable voltage drop also at the turn-on. When such a method is applied to the driving circuit, a current drive capacity at the on and off is not restricted. Therefore, it is effective in the driving circuit to use the latter current detection method.

However, when the short cut protection of the circuit using the above latter current detection method is provided to the driving circuit of Patent Document 1, the following problem occurs. That is, two paths in which an excessive current (short circuit current) may flow from the power supply exist in the driving circuit of Patent Document 1. Therefore, two current detecting circuits to detect voltages of two semiconductor switches that exist in the respective paths are needed. That is, in the driving circuit of Patent Document 1, the short circuit protection of the circuit becomes complicated. Thus, there is the problem that the circuitry is complicated in the driving circuit of Patent Document 1.

SUMMARY

An object of the present disclosure is to provide a driving circuit in which occurrence of malfunction due to noise can be restricted in driving a semiconductor device by use of a voltage supplied from one driving power supply while simplifying the circuitry.

A driving circuit of one aspect of the present disclosure is a driving circuit to drive a semiconductor device that opens and closes a current by applying a voltage supplied from a driving power supply directly or indirectly to a control terminal of the semiconductor device, and includes first to sixth semiconductor devices and an electricity storage portion.

The first semiconductor device is a semiconductor switch having a function that opens and closes at least a current in one direction. The second semiconductor device includes a semiconductor switch having a function that opens and closes at least a current in one direction or a rectifying device. The third semiconductor device is a semiconductor switch having a function that opens and closes at least a current in one direction. The fourth semiconductor device is a semiconductor switch having a function that opens and closes at least a current in one direction. The fifth semiconductor device includes a semiconductor switch having a function that opens and closes at least a current in one direction or a rectifying device. The sixth semiconductor device includes a semiconductor switch having a function that opens and closes at least a current in one direction or a rectifying device. The electricity storage portion has an electricity storage function.

One output terminal of the driving power supply is coupled to one current opening-and-closing terminal of the semiconductor device. The first semiconductor device is coupled to be disposed between the other output terminal of the driving power supply and an intermediate node. The fifth semiconductor device is coupled to be disposed between one terminal of the electricity storage portion and the intermediate node. The second semiconductor device is coupled to be disposed between the control terminal and the intermediate node. The third semiconductor device is coupled to be disposed between the one output terminal of the driving power supply and the one terminal of the electricity storage portion. The fourth semiconductor device is coupled to be disposed between the other terminal of the electricity storage portion and the control terminal. The sixth semiconductor device is coupled to be disposed between the other terminal of the electricity storage portion and the one output terminal of the driving power supply. A first state and a second state are provided in one cycle in which a voltage is applied to the control terminal of the semiconductor device. In the first state, when the first semiconductor device is closed, the third semiconductor device and the fourth semiconductor device are opened, and when the second semiconductor device includes a semiconductor switch, the semiconductor switch is closed. In the second state, the first semiconductor device is opened, and the third semiconductor device and the fourth semiconductor device are closed.

The driving circuit can restrict occurrence of malfunction due to noise while simplifying the circuitry.

BRIEF DESCRIPTION OF THE DRAWINGS

Additional objects and advantages of the present disclosure will be more readily apparent from the following detailed description when taken together with the accompanying drawings. In the drawings.

DETAILED DESCRIPTION

Figure 1:
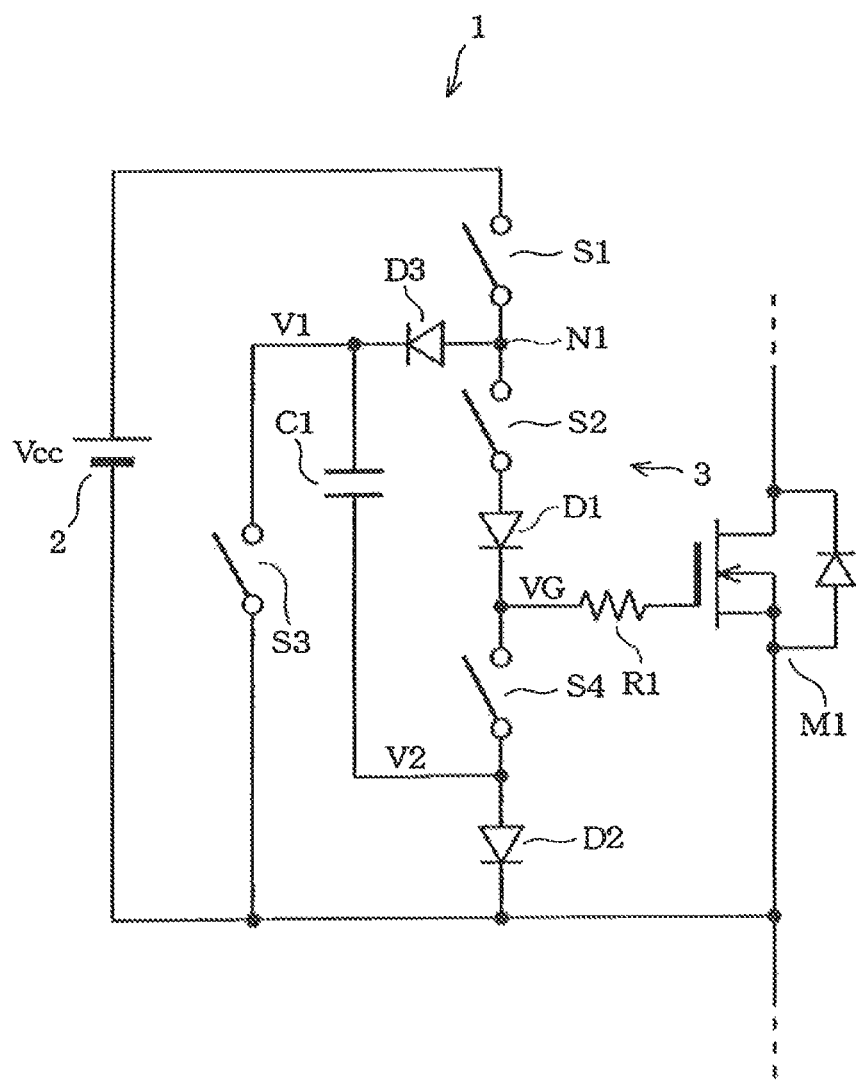
FIG. 1 is a diagram showing a driving circuit of a first embodiment of the present disclosure.

Hereafter, multiple embodiments of a driving circuit are described with reference to the drawings. It is noted that, in each embodiment, the same numerals indicate the substantially same components, and their explanations are omitted.

First Embodiment

A first embodiment of the present disclosure is hereafter described with reference to FIG. 1 to FIG. 4. A driving circuit 1 shown in FIG. 1 drives a semiconductor device M1 that opens and closes a current supplied to a load which is not illustrated. The semiconductor device M1 is a power MOSFET using a gallium nitride high electron mobility transistor (GaN-HEMT). A power semiconductor device using a GaN-HEMT is a device having high breakdown voltage, low on-resistance, and fast switching as characteristics. Therefore, the above power semiconductor device is widely expected to be a technology that greatly contributes to downsizing and high efficiency of a circuit. However, in general, the above power semiconductor device has a lower threshold voltage than those of an IGBT and Si-MOSFET. Therefore, there is a problem that malfunction is easy to occur in response to the noise at switching. The driving circuit 1 of the present embodiment, details of which are mentioned later, makes it possible to solve the above problem by use of a simple circuit (driving method) without using a highly complicated driving method.

The driving circuit 1 applies a voltage supplied directly or indirectly from a driving power supply 2 to the gate (corresponding to a control terminal) of the semiconductor device M1. The driving circuit 1 includes switches S1 to S4, diodes D1 to D3, a capacitor C1 (corresponding to an electricity storage portion), and a resistor R1. A reverse conductive semiconductor switch in which a reverse current flows regardless of a state of the control terminal or a reverse blocking semiconductor switch in which no reverse current flows regardless of a state of the control terminal is used as the switches S1 to S4. As an example of the reverse conductive semiconductor switch, a metal oxide semiconductor field effect transistor (MOSFET) is given. As examples of the reverse blocking semiconductor switch, a bipolar junction transistor (BJT), a junction field effect transistor (JFET), an insulated gate bipolar transistor (IGBT), etc. are given. It is noted that the reverse blocking semiconductor switch may includes two MOSFETs coupled to one another in anti-series (bidirectional switch).

The driving power supply 2 is a positive power supply that outputs a positive voltage Vcc. The voltage Vcc is over a threshold voltage (gate threshold voltage) of the semiconductor device M1, for example, 5V. A high voltage side output terminal (corresponding to the other output terminal) of the driving power supply 2 is coupled to a node N1 (corresponding to an intermediate node) via the switch S1 (corresponding to a first semiconductor device). A low voltage side output terminal (corresponding to one output terminal) of the driving power supply 2 is coupled to the source (corresponding to one current opening-and-closing terminal) of the semiconductor device M1. The diode D3 (corresponding to a fifth semiconductor device or a rectifying device) is coupled between the node N1 and one terminal of the capacitor C1, and has the anode on the side of the node N1. One terminal of the capacitor C1 (cathode of the diode D3) is coupled to the low voltage side output terminal of the driving power supply 2 via the switch S3 (corresponding to a third semiconductor device).

One terminal of the switch S2 is coupled to the node N1. The other terminal of the switch S2 is coupled to the anode of the diode D1 (corresponding to a rectifying device). That is, the switch S2 and the diode D1 are coupled in series. This series circuit corresponds to a second semiconductor device 3. The cathode of the diode D1 is coupled to the gate of the semiconductor device M1 via the resistor R1 that is a gate resistor.

One terminal of the switch S4 (corresponding to a fourth semiconductor device) is coupled to the gate of the semiconductor device M1 via the resistor R1. The other terminal of the switch S4 is coupled to the anode of the diode D2 (corresponding to a sixth semiconductor device or a rectifying device). The anode of the diode D2 is coupled to the other terminal of the capacitor C1. The cathode of the diode D2 is coupled to the low voltage side output terminal of the driving power supply 2.

Figure 2:
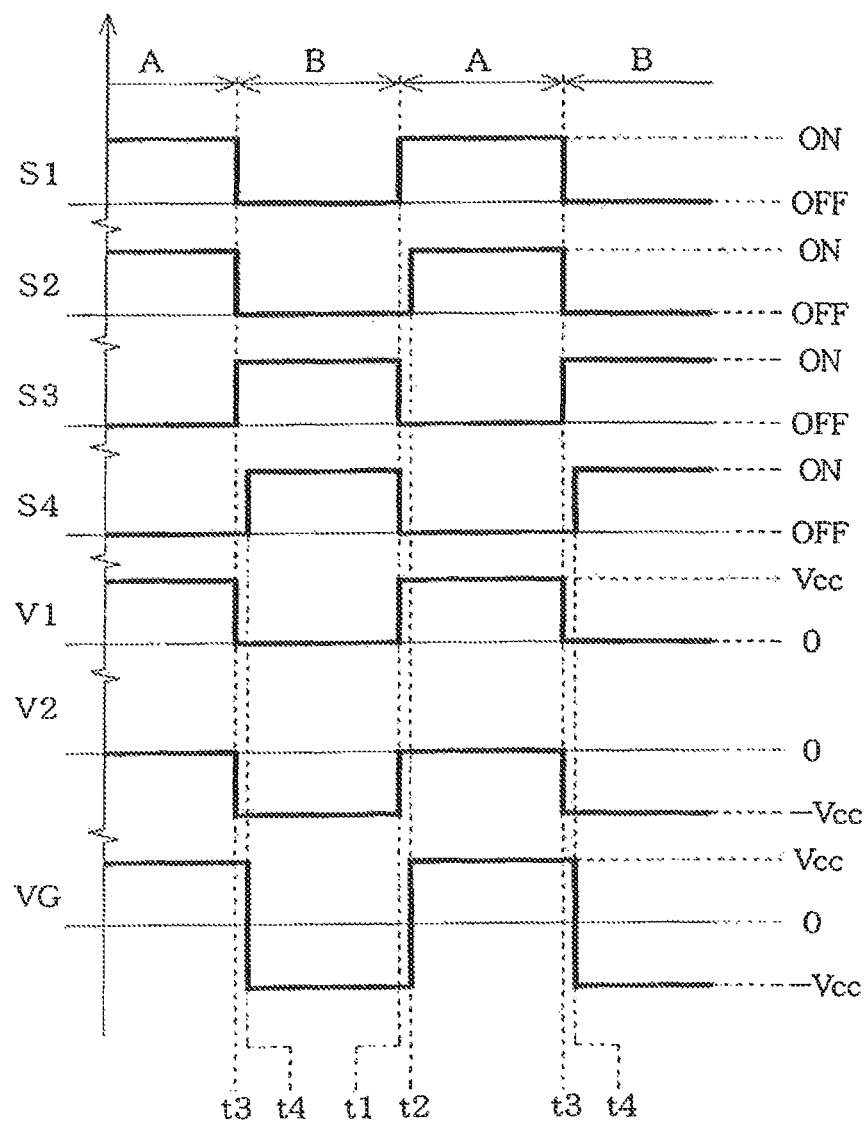
FIG. 2 is a diagram showing opening and closing of each switch and a voltage wave of each portion.
Figure 3:
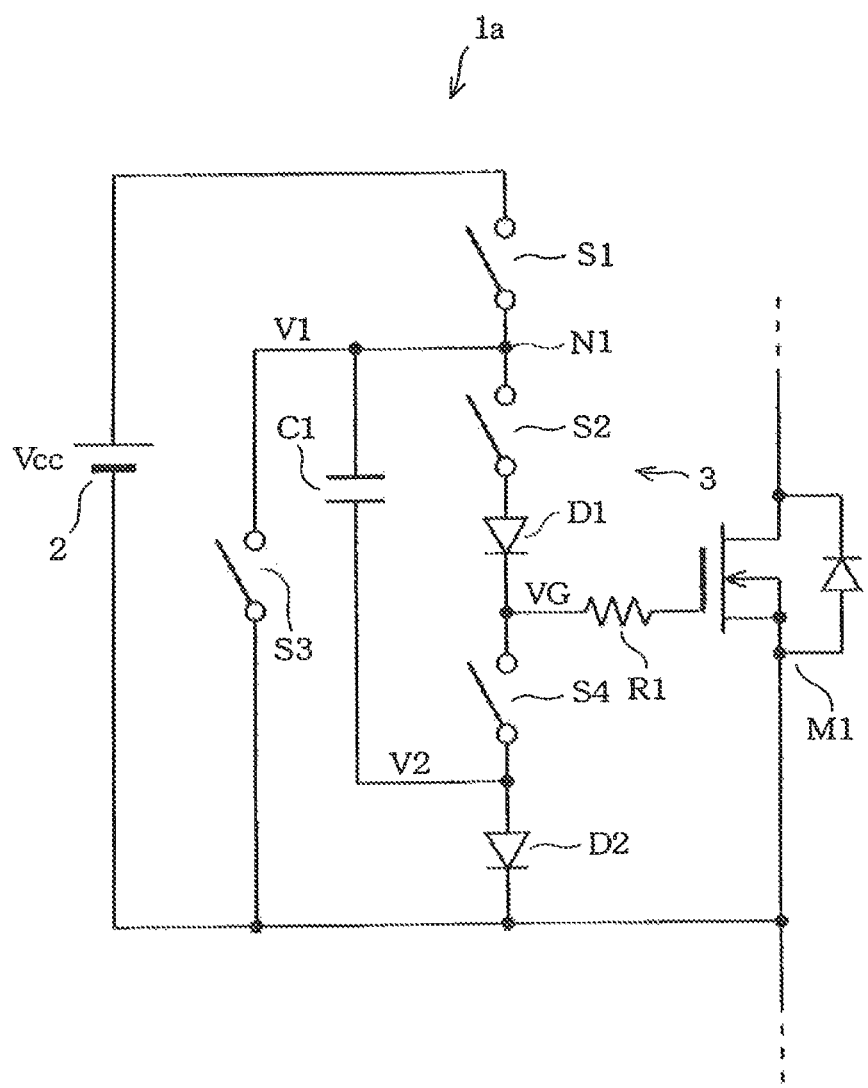
FIG. 3 is a diagram showing a driving circuit of a modification of the first embodiment, in which one diode is omitted.

The switches S1 to S4 are turned on and off (opened and closed) in response to a control signal provided from a control circuit, which is not illustrated. As shown in FIG. 2, the switches S1 and S2 are turned on and off in synchronization with one another, and the switches S3 and S4 are turned on and off in synchronization with one another. The switches S1, S2 and the switches S3, S4 are turned on/off complementarily. However, on-periods of the switches S1 and S2 do not coincide with one another completely. Specifically, a start point t2 of the on-period of the switch S2 is delayed compared to a start point t1 of the on-period of the switch S1 in some degree. In other words, the switch S1 is turned on before the switch S2 is turned on. Additionally, the on-periods of the switches S3 and S4 do not coincide with one another completely. Specifically, a start point t4 of the on-period of the switch S4 is delayed compared to a start point t3 of the on-period of the switch S3 in some degree. In other words, the switch S3 is turned on before the switch S4 is turned on.

Next, driving operation of the semiconductor device M1 in the driving circuit 1 of the above structure is explained.

As shown in FIG. 2, a period A and a period B exist in one cycle of on and off of the semiconductor device M1. In the period A, the switches S1 and S2 are closed, and the switches S3 and S4 are opened (corresponding to a first state). As a result, the gate of the semiconductor device M1 is coupled to the high potential side output terminal of the driving power supply 2 via the switches S1, S2, diode D1, and resistor R1. Additionally, the source of the semiconductor device M1 is coupled to the low voltage side output terminal of the driving power supply 2. Therefore, the positive voltage Vcc is applied between the gate and source of the semiconductor device M1 (VG=Vcc), and the semiconductor device M1 enters the on-state. At this time, the capacitor C1 is coupled to the driving power supply 2 in parallel via the switch S1, diode D3, and diode D2. Therefore, the capacitor C1 is charged up to the voltage Vcc in the period A. That is, as shown in FIG. 2, one terminal of the capacitor C1 is positive, and the voltage V1 is Vcc. The other terminal of the capacitor C1 is negative, and the voltage V2 is 0 V. It is noted that a forward voltage of a diode, a voltage drop due to an on-resistance of a semiconductor switch and the like are not considered because they do not affect important operation.

In the period B, the switches S1 and S2 are opened, and the switches S3 and S4 are closed (corresponding to the second state). As a result, the gate of the semiconductor device M1 is coupled to the other terminal (negative side) of the capacitor C1 via the switch S4 and resistor R1. Additionally, one terminal (positive side) of the capacitor C1 is coupled to the low voltage side output terminal (the source of the semiconductor device M1) of the driving power supply 2 via the switch S3. Therefore, a negative voltage −Vcc is applied between the gate and source of the semiconductor device M1 (VG=−Vcc), and the semiconductor device M1 enters the off-state.

When the switch S4 is in the off-state and the switch S3 is in the on-state in a transient state from the period A to the period B, the existence of the diode D1 (rectification) prevents a gate potential of the semiconductor device M1 from being drawn to 0 V via the switch S3 that has been turned on (prevents a short circuit condition between the gate and source). Additionally, the existence of the diode D2 (rectification) prevents an electric charge of the capacitor C1 being discharged via the path of "the positive electrode side→the switch S3 that has been turned on→the negative electrode side."

In the period B, an electric charge of a parasitic capacitance of the gate of the semiconductor device M1 is discharged via the capacitor C1. A change ΔVc of a terminal voltage of the capacitor C1 due to the discharge is represented by Equation (1). It is noted that a differential voltage between a gate potential (Vcc) in the period A and a gate potential (−Vcc) in the period B is represented by Δvg (=2·Vcc), a capacitance of the capacitor C1 is represented by C, and a parasitic capacitance of the gate of the semiconductor device M1 is represented by Cg.

$$\Delta Vc = (Cg/C) \cdot \Delta Vg \tag{1}$$

When the change ΔVc of the terminal voltage of the capacitor C1 is great, the terminal voltage of the capacitor C1 at the start of the next period A is low. This may cause an excessive current flow (rush current) at the start of charge. Therefore, the change ΔVc with the electric charge mentioned above is desirably small. From the above Equation (1), it is understood that the capacitance C of the capacitor C1 may be set to a sufficiently large value compared to a parasitic capacitance Cg of the gate to make the change ΔVc small.

For example, the capacitance C of the capacitor C1 may be set to ten or more times of the parasitic capacitance Cg of the gate. With such a value, in the present embodiment in which "Vcc=5V" is set, the change ΔVc of the gate potential in the period B can be controlled to within 1V. As a result, the terminal voltage of the capacitor C1 at the start of the next period A becomes 4V or more. That is, when the terminal voltage in a state in which the capacitor C1 has been charged to Vcc is 100%, the terminal voltage of the capacitor C1 at the start of the next period A is kept at a value of 80% or more.

It is noted that a value of the capacitance C of the capacitor C1 may be set to an appropriate value in accordance with various conditions such as a value of the voltage Vcc of the driving power supply 2 to be used, a circuit constant of, e.g., a value of the gate parasitic capacitance of the semiconductor device M1 to be driven, and to which degree a change (drop) of the terminal voltage of the capacitor C1 in the period B is permitted.

As explained above, the driving circuit 1 of the present embodiment can apply both positive and negative voltages to the gate of the semiconductor device M1 by using one driving power supply 2 that is a positive power supply to output a positive voltage without using a positive driving power supply and a negative driving power supply. Therefore, a voltage applied to the gate to drive off the semiconductor device M1 is largely far from the threshold voltage, and even when the noise etc. at the switching is superimposed on the gate, malfunction (erroneous turn-on) due to that can be prevented. That is, according to the present embodiment, the same effect as the case in which a positive driving power supply and a negative driving power supply are used is obtained. Additionally, the number of semiconductor switches that form the driving circuit 1 of the present embodiment may be four. Therefore, it can be said that the driving circuit 1 has a simpler structure than that of a conventional driving circuit that needs five semiconductor switches. That is, according to the present embodiment, the equivalent function to the conventional technology is realizable by the simpler circuit.

Now, in integration of the driving circuit 1, the output terminal of the driving circuit 1 (a portion coupled to the gate of the semiconductor device M1) and both terminals of the capacitor C1 are coupled to external terminals exposed out of the package. In this case, an abnormality in which those external terminals are shorted to the GND, an abnormality in which each external terminal is shorted to each other and the like. may occur. Particularly, when the output terminal of the driving circuit 1 and the high potential side terminal of the capacitor C1 are shorted to the GND, when both terminals of the capacitor C1 are shorted to cause a short circuit malfunction and the like, the driving power supply 2 is shorted through the period A in which the semiconductor device M1 is turned on. Accordingly, a great current (short circuit current) may flow in the circuit. Therefore, malfunction may occur in the driving circuit 1, and additionally, the power supply potential of the driving power supply 2 becomes unstable. This may result in malfunction of all the devices that receive the power supply from the driving power supply 2. From such a situation, it is necessary to provide a short circuit protection of a circuit in the driving circuit 1.

According to the structure of the present embodiment, the short circuit protection of the circuit can be performed easily as follows. That is, in the driving circuit 1, the short circuit current mentioned above certainly passes through the switch S1. For example, when the output terminal of the driving circuit 1 is shorted to the GND, the short circuit current flows via the switch S1, the switch S2, the diode D1, and the resistor R1. When a short circuit malfunction occurs in the capacitor C1, the short circuit current flows via the switch S1, the diode D3, and the diode D2. As a result, according to the structure of the present embodiment, when a potential difference (voltage drop) between the respective terminals of the switch S1 is monitored, it is possible to detect an excess current, and the short circuit protection can be realized only by providing one current detecting circuit. Therefore, according to the present embodiment, an effect that the driving circuit 1 can be provided to prevent the malfunction due to noise while simplifying the circuitry is obtained.

By reducing the number of the semiconductor switches that form the driving circuit 1, the following effect is also obtained. That is, a circuit area of the driving circuit 1 is reduced by the reduction of the semiconductor switches, and a production cost of the driving circuit 1 is reduced. Additionally, each circuit device that forms the driving circuit 1 is compactly arranged by reducing the circuit area. As a result, a wiring length (especially a length of the wiring around the gate of the semiconductor device M1) for coupling of each circuit device can be shorted to further improve the noise resistance.

The semiconductor device M1 to be driven is a power MOSFET using a GaN-HEMT considered to have a relatively lower threshold voltage. Therefore, the driving circuit 1 of the present embodiment that provides an effect to prevent an erroneous turn-on due to noise by use of relatively simple circuitry and the driving method is very useful for practical applications of power semiconductor devices using GaN-HEMTs. Further, since charging and discharging of the gate in a short time is needed for fast switching, which is an advantage of GaN-HEMTs, a great current flows in the driving circuit 1 at the moment of switching. Therefore, a semiconductor switch used for the driving circuit 1 may need a size enough to withstand the above great current. This is a factor of high production cost. Therefore, the driving circuit 1 of the present embodiment that can be structured using the smaller number of semiconductor switches is very useful also for the production cost reduction in practical applications of power semiconductor devices using GaN-HEMTs.

However, in comparison with a conventional driving circuit, three diodes D1 to D3 are added to the driving circuit 1. However, a diode has a simpler structure than a semiconductor switch, a higher tolerance to a current than a semiconductor switch having a similar size thereto, and an ability allow a great current to flow instantly. Therefore, the diodes D1 to D3 can be equipped with smaller semiconductor chips than semiconductor switches. Therefore, the addition of the diodes does not spoil the above effect.

When the switch S1 and switch S2 are closed to transition to the first state (at the head of the period A), and when the switch S2 is closed before the switch S1 is closed, the following problem occurs. That is, in this case, the switch S2 has been already turned on at the start of the on-state of the switch S1. Then, charging of both the capacitor C1 and of the gate parasitic capacitance of the semiconductor device M1 is both started from the start of the on-state of the switch S1. When the capacitor C1 and gate parasitic capacitance are charged simultaneously, a charge rate of the gate parasitic capacitance becomes slow, and additionally a turn-on time of the semiconductor device M1 becomes long.

On the other hand, in the present embodiment, at the head of the period A, the switch S1 is closed before the switch S2 is closed. Therefore, only the capacitor C1 is charged from the start of the on-state of the switch S1 to the start of the on-state of the switch S2. Then, since the charging of the gate parasitic capacitance is started from the start of the on-state of the switch S2 after the charging of the capacitor C1 has completed to some extent, its charging rate is prevented from being slow. Therefore, according to the present embodiment, the semiconductor device M1 can be turned on more rapidly.

When the switch S3 and switch S4 are closed to transition to the second state (at the head of the period B) and when the switch S4 is closed before the switch S3 is closed, the following problem occurs. That is, in this case, the switch S4 has been turned on in the period of the off-state of the switch S3. Thus, since the gate charge flows into the source via the switch S4 and diode D2, the gate potential is drawn to 0 V in this period (period in which the switch S3 is off and the switch S4 is on). Thus, the gate potential is once drawn to 0 V, by which the turn-off time of the semiconductor device M1 becomes long.

On the other hand, in the present embodiment, the switch S3 is closed at the head of the period B before the switch S4 is closed. Therefore, the gate potential of the semiconductor device M1 is drawn directly to the negative voltage −Vcc from the start of the on-state of the switch S4. Therefore, according to the present embodiment, the semiconductor device M1 can be turned off at a higher rate.

Immediately after the power supply is supplied to the driving circuit 1, the capacitor C1 can be also considered to have been discharged. In the state in which the capacitor C1 has been discharged, when the switch S1 is turned on, an excessive rush current may flow through the switch S1. Therefore, it is necessary for the switch S1 and the diodes D2 and D3 to have an ability to withstand the above rush current. Additionally, when the driving circuit 1 is powered on while the capacitor C1 has been discharged, a turn-on time when the semiconductor M1 is turned on initially may become rather long (a rise rate of the gate decreases). This can be solved by using a structure of another embodiment which is described later.

In the above structure, it is possible to replace coupling positions of the switch S2 and diode D1. Additionally, when a reverse blocking semiconductor switch is used as the switch S2 or when there is no concern that the gate of the M1 is drawn to 0 V in association with a closing operation of the switch S3 because of sufficiently high rate of switching from the first state to second state, the diode D1 can be omitted. In this case, the second semiconductor device 3 is formed of the switch S2. Further, it is possible to omit any one of the switch S2 and diode D3. As shown in a driving circuit 1a of FIG. 3, when the diode D3 is omitted, one terminal of the capacitor C1 may be coupled to the node N1 directly. Also according to such a structure, the same action and effect as the structure of FIG. 1 are obtained. Further, the circuitry becomes simpler by the omission of the diode D3.

Figure 4:
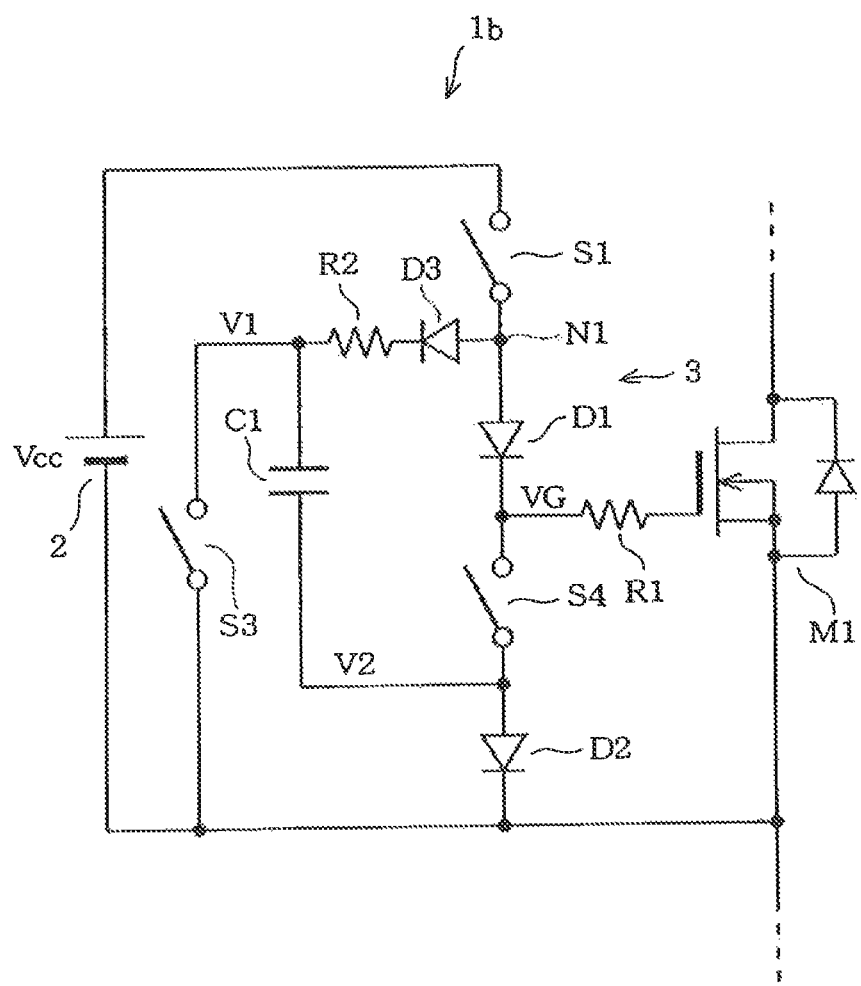
FIG. 4 is a diagram showing a driving circuit of a modification of the first embodiment, in which one switch is omitted.

When the switch S2 is omitted, the anode of the diode D1 may be coupled to the node N1 directly, as shown in a driving circuit 1b of FIG. 4. In this case, the second semiconductor device 3 is formed of the diode D1. In such a structure, in the period B, the existence of the diode D3 (rectification) prevents an electric charge of the capacitor C1 from being discharged via the path of "the positive electrode side→the diode D1→the switch S4 that has been turned on→the negative electrode side."

Thus, when the switch S2 is omitted, it is difficult to obtain the above effect of shifting the start points of the on-periods of the switches S1 and S2. That is, when the switch S2 is omitted, charging of the capacitor C1 and charging of the gate parasitic capacitance are simultaneously started in the head of the period A. Accordingly, the on-rate of the semiconductor device M1 is restricted. This problem is made clearer with increase in the capacitance of the capacitor C1. To solve such a problem, as shown in FIG. 4, the resistor R2 for rush-current restriction may be added between the cathode of the diode D3 and one terminal of the capacitor C1. The existence of this resistor R2 restricts a charging current to the capacitor C1. A charging current to the gate parasitic capacitance of the semiconductor device M1 increases by that inhibition. Therefore, the problem of reduction of the on-rate of the semiconductor device M1 is resolved.

Second Embodiment

Figure 5:
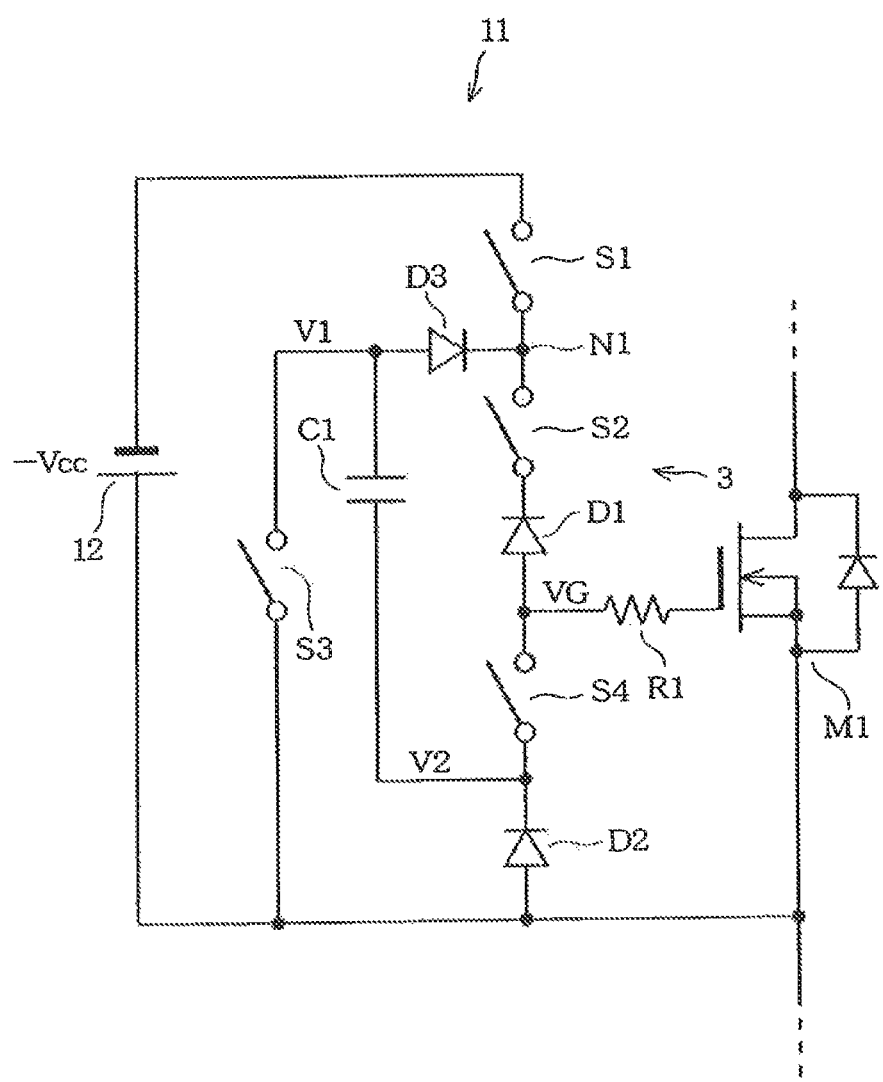
FIG. 5 is a diagram showing a driving circuit of a second embodiment of the present disclosure.

Hereafter, a second embodiment of the present disclosure is described with reference to FIG. 5. A driving circuit 11 of the present embodiment shown in FIG. 5 is different from the driving circuit 1 of the first embodiment shown in FIG. 1 in that a driving power supply 12 is provided instead of the driving power supply 2 and in the topology of the diodes D1 to D3.

The driving power supply 12 is a negative power supply to output the negative voltage −Vcc. The low voltage side output terminal (corresponding to the other output terminal) of the driving power supply 12 is coupled to the node N1 via the switch S1. The high potential side output terminal (corresponding to one output terminal) of the driving power supply 12 is coupled to the source of the semiconductor device M1. With the driving power supply 12 that outputs such a negative voltage −Vcc, directions of the diodes D1 to D3 are reversed. Open and close timings of the switches S1 to S4 (operation sequence of the driving circuit 11) are the same as the timings shown in FIG. 2. However, a voltage waveform of each portion obtained in this case is one whose positive and negative are reversed relative to the waveform shown in FIG. 2.

Thus, the driving circuit 11 of the present embodiment can apply both positive and negative voltages to the semiconductor M1 by using one driving power supply 12 that is a negative power supply to output a negative voltage without using a positive driving power supply and a negative driving power supply. Therefore, the same action and effect as the first embodiment are obtained also by the present embodiment.

Also in the driving circuit 11 of the present embodiment, it is necessary for the switch S1 and the diodes D2 and D3 to have an ability to withstand the above rush current. However, in the present embodiment, even when the driving circuit 11 is powered on while the capacitor C1 has been discharged, the turn-on time when the semiconductor device M1 is turned on initially is not made rather long (a rise rate of the gate does not decrease). This is because charging of the capacitor C1 and discharging (turn-off) of the gate parasitic capacitance of the semiconductor device M1 are simultaneously performed in the period A in the present embodiment. That is, since charging of the capacitor C1 and charging of the gate parasitic capacitance of the semiconductor device M1 are not simultaneously performed in the present embodiment, a problem that the above turn-on time becomes long does not occur.

It is noted that, also in the above structure, the same modification as the first embodiment is possible. That is, it is possible to replace coupling positions of the switch S2 and diode D1. Additionally, when the reverse blocking semiconductor switch is used as the switch S2 or when there is no concern that the gate of the M1 is drawn to 0 V in association with an operation of closing the switch S3 because of a sufficiently high rate of switching from the first state to the second state, the diode D1 can be omitted. Further, it is possible to omit any one of the switch S2 and the diode D3.

Third Embodiment

Figure 6:
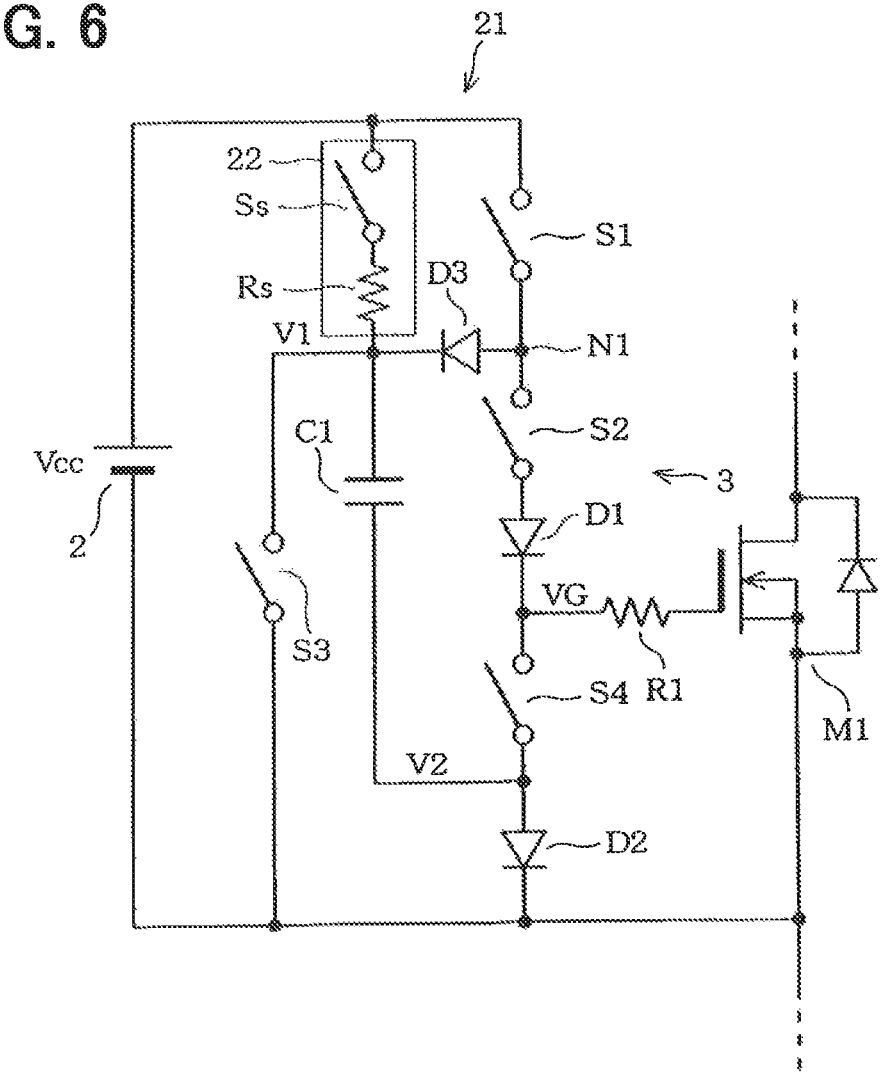
FIG. 6 is a diagram showing a driving circuit of a third embodiment of the present disclosure.
Figure 7:
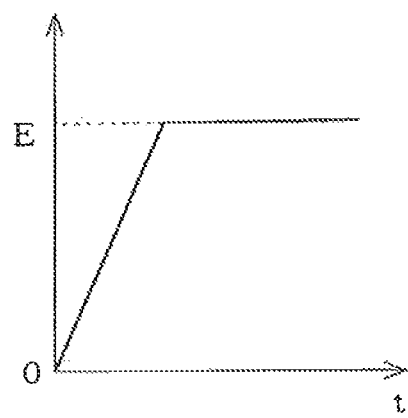
FIG. 7 is a diagram showing an output voltage of the driving power supply at power-on in the third embodiment.

A third embodiment of the present disclosure is hereafter described with reference to FIG. 6 and FIG. 7. A driving circuit 21 of the present embodiment shown in FIG. 6 is different from the driving circuit 1 of the first embodiment shown in FIG. 1 in that a startup circuit 22 is added. The startup circuit 22 charges the capacitor C1 when the driving circuit 21 is powered on. The startup circuit 22 includes a series coupling of a switch Ss and a resistor Rs. The switch Ss includes a semiconductor switch that allows a smaller current than those of the switches S1 to S4 to flow. One terminal of the switch Ss is coupled to the high potential side output terminal of the driving power supply 2. The other terminal of the switch Ss is coupled to one terminal of the capacitor C1 via the resistor Rs.

Next, an operation at the power-on of the driving circuit 21 is explained, which is one of the operations in the driving circuit 21 of the above structure. As shown in FIG. 7, in a period (rise period) in which an output voltage of the driving power supply 2 reaches from 0 V to a predetermined voltage E (for example, voltage Vcc), the switch S1 is turned off and the switch S4 is turned on. As a result, the gate potential of the semiconductor device M1 is certainly set to 0 V, and a situation in which the gate parasitic capacitance is charged by, e.g., a dark current to turn on the semiconductor device M1 is prevented. In such a state, when the output voltage of the driving power supply 2 reaches a voltage E, the switch Ss of the startup circuit 22 is turned on. Accordingly, while the semiconductor device M1 is maintained off, the capacitor C1 is charged through the startup circuit 22.

Then, the switch Ss is turned off after a predetermined time has elapsed. As a result, the charging operation to the capacitor C1 by the startup circuit 22 is stopped. The above predetermined time may be set to charge the capacitor C1 sufficiently. For example, the predetermined time may be set to charge the terminal voltage of the capacitor C1 to or over 80% of the voltage Vcc. In such a way, the charging current to the capacitor C1 at the initial turn-on of the switch S1 after the power-on is restricted to the same level as the charging current at the transition from the period B to period A. After that, the switches S1 to S4 are opened and closed at the timings shown in FIG. 2.

According to such a structure, the same action and effect as the first embodiment are obtained, and the following effect is also obtained. That is, the driving circuit 21 of the present embodiment includes the startup circuit 22 to previously charge the capacitor C1 at the power-on to the driving circuit 21. Therefore, when the switch S1 is turned on initially after the power-on, the capacitor C1 has been already charged to some extent. Therefore, even when the driving circuit 21 is powered on while the capacitor C1 has been discharged, no excessive rush current flows through the switch S1 when the switch S1 is turned on initially. Therefore, the switch S1 and the diodes D2 and D3 are not required to withstand a rush current. Additionally, since the problem about the above rush current does not occur, the turn-on time at the initial turn-on of the semiconductor device M1 does not become rather long (a rise rate of the gate does not decrease) even when the driving circuit 21 is powered on while the capacitor C1 has been discharged.

It is noted that the charging to the capacitor C1 by the startup circuit 22 (hereinafter also called a startup operation) may be performed not only at the power-on of the driving circuit 21 but also, e.g., before a return from a rest state in the intermittent operation of the driving circuit 21. As the above intermittent operation, a standby mode in which the overall system enters a rest state, a burst mode in which switching is stopped at low load and a power supply is performed from a smoothing capacitor, etc. can be considered. When duration of the rest state is long in the intermittent operation, the electric charge stored in the capacitor C1 may be lost by a leakage current and the like. Therefore, charging is performed by the startup circuit 22 at the return from the rest state.

Accordingly, a drop of the on-rate at the initial turn-on of the semiconductor device M1 after the return from the rest state can be restricted.

Additionally, the startup operation may be performed in a partial period in the off-drive period of the semiconductor M1 (second state) when the driving circuit 21 performs normal operation (steady state). For example, immediately after the turn-off of the semiconductor device M1, it is necessary to apply a negative voltage to the gate of the semiconductor device M1 to prevent malfunction (erroneous turn-on) due to switching noise. However, after the switching noise is settled, a negative voltage may not need to be applied to the gate. Then, when a negative voltage may not need to be applied to the gate, the start-up operation can be performed to preliminary charge to the capacitor C1. In this case, the startup operation is performed after the second state which is performed and adjacent to the first state. In such a way, in the steady time, the charging current to the capacitor C1 at the start of the on-drive period of the semiconductor device M1 is restricted, and the charging current to the gate parasitic capacitance of the semiconductor device M1 increases by the restriction. Therefore, a drop of the on-rate of the semiconductor device M1 is restricted.

Since the switch Ss of the startup circuit 22 need not to allow a great current to flow as mentioned above, the switch Ss has a low current capability. Therefore, even when the switch Ss is shorted, there is no possibility that a great current may flow therethrough. Therefore, in the structure of the present embodiment, to provide the short circuit protection, it is not necessary to monitor (detect) a current flowing in the switch Ss. That is, also in the present embodiment, in the same manner as the first embodiment, the short circuit protection is realizable only by providing one current detection circuit. The switch Ss of the startup circuit 22 may be omitted in the above structure. In this case, one terminal of the resistor Rs may be coupled to the high potential side output terminal of the driving power supply 2. In such a way, the circuit area can be reduced by the omission of the switch Ss, and a control content of the switch can be simplified.

Fourth Embodiment

Figure 8:
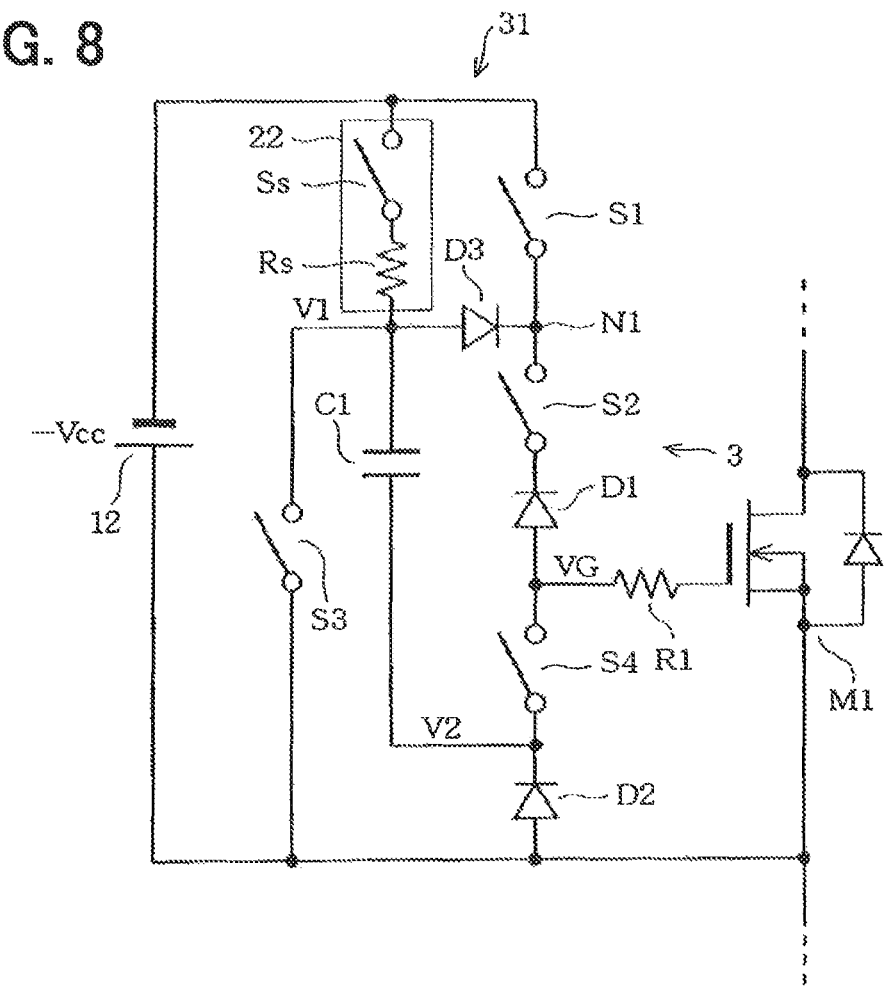
FIG. 8 is a diagram showing a driving circuit of a fourth embodiment of the present disclosure.

A fourth embodiment of the present disclosure is hereafter described with reference to FIGS. 8 and 9. The driving circuit 31 of the present embodiment shown in FIG. 8 is different from the driving circuit 11 of the second embodiment shown in FIG. 5 in that the startup circuit 22 is added. The structure and operations of the startup circuit 22 are as explained in the third embodiment. In the driving circuit 31 using a negative power supply, the gate parasitic capacitance is not charged and turned on by a dark current that flows in the circuit. Therefore, in the present embodiment, the control method of switching at the power-on is rather different from that of the third embodiment.

Figure 9:
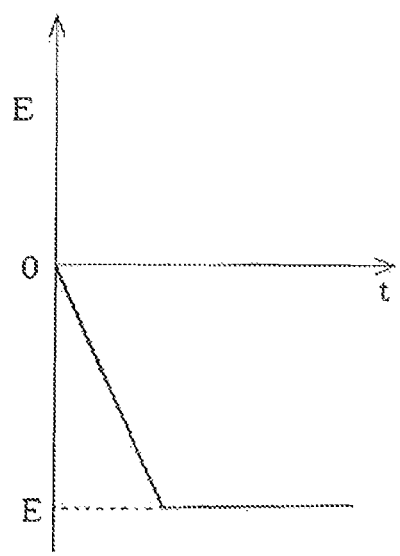
FIG. 9 is a diagram showing an output voltage of the driving power supply at power-on in the fourth embodiment.

That is, as shown in FIG. 9, the switches S1 and S4 are turned off while an output voltage of the driving circuit 31 reaches from 0 V to a predetermined voltage E (for example, the voltage −Vcc). Thus, although the gate of the semiconductor device M1 is floated, the semiconductor device M1 is not turned on accidentally because of the above reason. In such a situation, when the output voltage of the driving circuit 31 reaches the voltage E, the switch Ss of the startup circuit 22 is turned on. Thus, while the semiconductor device M1 is maintained off, the capacitor C1 is charged through the startup circuit 22. Then, the switch Ss is turned off after a predetermined time elapses. As a result, the charging to the capacitor C1 by the startup circuit 22 is stopped. After that, opening and closing of the switches S1 to S4 are performed at the timings shown in FIG. 2.

According to such a structure, the same action and effect as in each above embodiment are obtained. It is noted that, in the same manner as the third embodiment, the charging operation to the capacitor C1 by the startup circuit 22 may be performed not only at the power-on to the driving circuit 31 but also, for example, before the return from the rest state in the intermittent operation of the driving circuit 31.

Fifth Embodiment

Figure 10:
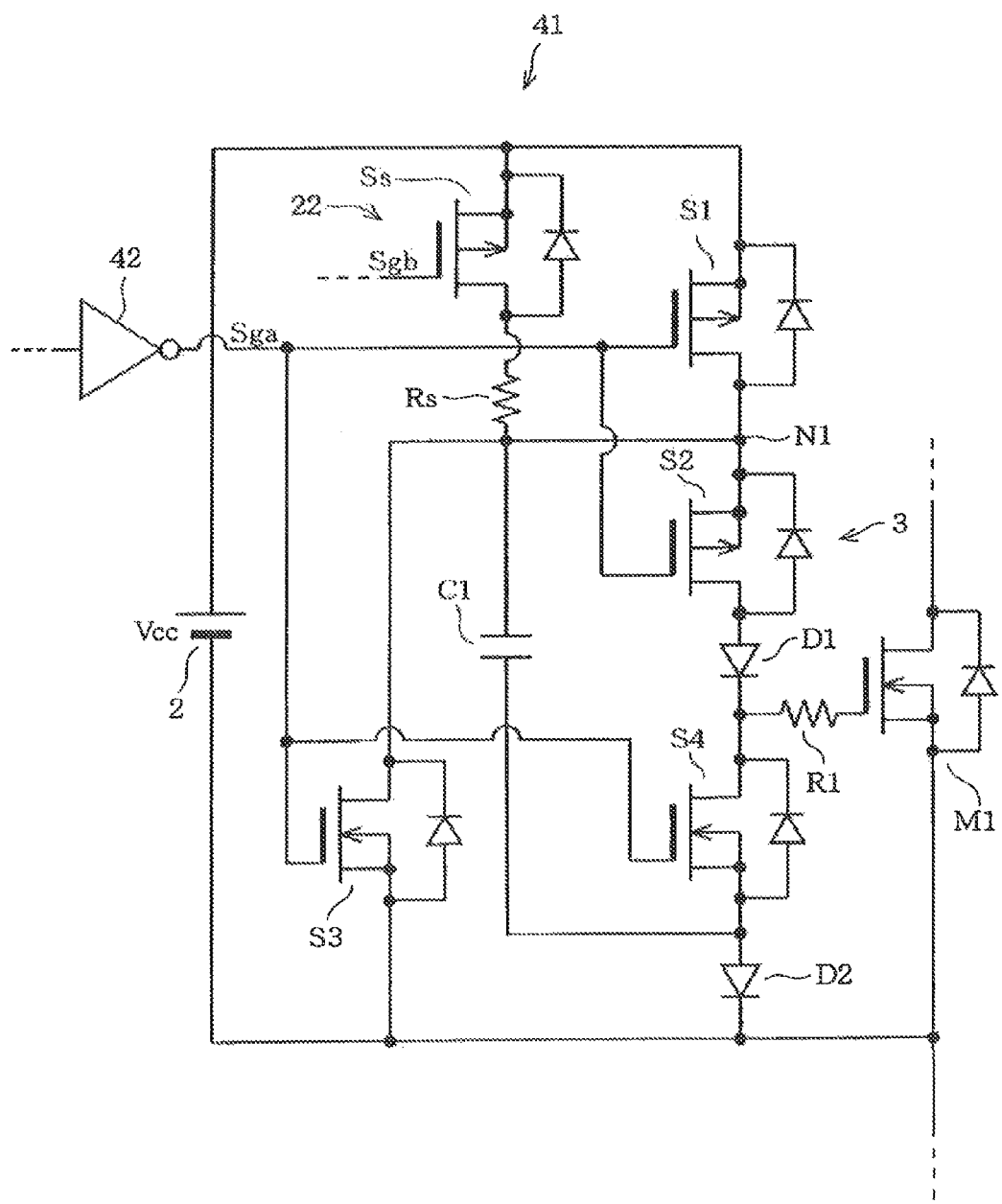
FIG. 10 is a diagram showing a driving circuit of a fifth embodiment of the present disclosure.

A fifth embodiment of the present disclosure is hereafter described with reference to FIGS. 10 and 11. A driving circuit 41 of the present embodiment corresponds to the driving circuit 21 of the third embodiment from which the diode D3 is omitted. As shown in FIG. 10, the switches S1 and S2 are P channel MOSFETs. The source of the switch S1 is coupled to the high potential side output terminal of the driving power supply 2. The drain of the switch S1 and the source of the switch S2 are coupled to the node N1. The drain of the switch S2 is coupled to the anode of the diode D1.

The switches S3 and S4 are N channel MOSFETs. The drain of the switch S3 is coupled to one terminal of the capacitor C1. The source of the switch S3 is coupled to the low voltage side output terminal of the driving power supply 2. The drain of the switch S4 is coupled to the gate of the semiconductor device M1 via the resistor R1. The source of the switch S4 is coupled to the anode of the diode D2.

A gate driver 42 outputs a gate signal Sga based on a control signal provided from a control circuit which is not illustrated. The gate signal Sga is provided to the gate of the switches S1 to S4. That is, the switches S1 to S4 are opened and closed by the common gate signal Sga. Specifically, when the gate signal Sga is at L level (0 V), the switches S1 and S2 are turned on (closed), and the switches S3 and S4 are turned off (opened). When the gate signal Sga is at H level (voltage Vcc), the switches S1 and S2 are turned off (opened), and the switches S3 and S4 are turned on (closed).

The switch Ss that forms the startup circuit 22 is a P channel MOSFET. The source of the switch Ss is coupled to the high potential side output terminal of the driving power supply 2. The drain of the switch Ss is coupled to one terminal of the capacitor C1 via the resistor Rs. The gate signal Sgb based on a control signal provided from the control circuit, which is not illustrated, is provided to the gate of the switch Ss. That is, the switch Ss is opened and closed by the gate signal Sgb. Specifically, the switch Ss is turned on when the gate signal Sgb is at L level (closed), and is turned off (opened) when the gate signal Sgb is at H level.

It can be said that, since the driving circuit 41 of the present embodiment uses MOSFETs as the switches S1 to S4 and Ss, the driving circuit 41 is very advantageous and has a practical structure when the driving circuit 41 is made into a semiconductor integrated circuit (IC). Additionally, since the switches S1 and S2 use P channel types and the switches S3 and S4 use N channel types, the switches S1 to S4 can be opened and closed by the common gate signal Sga. Therefore, an effect that the driving circuit 41 of the present embodiment can simplify the structure of generating the gate signal Sga (control signal) is obtained.

However, the driving circuit 41 of the present embodiment cannot shift start points of the on-periods of the switches S1 and S2, and cannot shift start points of the on-periods of the switches S3 and S4. Such a point is soluble by adding delay circuits 43 and 44 to the driving circuit 41 shown in FIG. 10, as in a driving circuit 41a shown in FIG. 11. The delay circuit 43 includes diodes D41, D42, a resistor R41, and a capacitor C41. The anode of the diode D41 and the cathode of the diode D42 are commonly coupled, and coupled to the output terminal of the gate driver 42. The anode of the diode D42 is grounded via the resistor R41 and the capacitor C41. An interconnection point of the resistor R41 and the capacitor C41 is coupled to the cathode of the diode D41 and to the gate of the switch S2. With such a structure, the delay circuit 43 provides, to the gate of the switch S2, a delay gate signal to delay the timing from H level to L level by a predetermined time relative to the gate signal Sga. The above predetermined time is defined by a time constant of a CR circuit including the resistor R41 and the capacitor C41.

The delay circuit 44 includes diodes D43, D44, a resistor R42, and a capacitor C42. The cathode of the diode D43 and the anode of the diode D44 are commonly coupled, and coupled to the output terminal of the gate driver 42. The cathode of the diode D44 is grounded via the resistor R42 and the capacitor C42. The interconnection of the resistor R42 and the capacitor C42 is coupled to the anode of the diode D43 and to the gate of the switch S4. With such a structure, the delay circuit 44 provides, to the gate of the switch S4, the delay gate signal to delay the timing from L level to H level by a predetermined time relative to the gate signal Sga. The above fixed time is defined by a time constant of a CR circuit including the resistor R42 and the capacitor C42.

Figure 11:
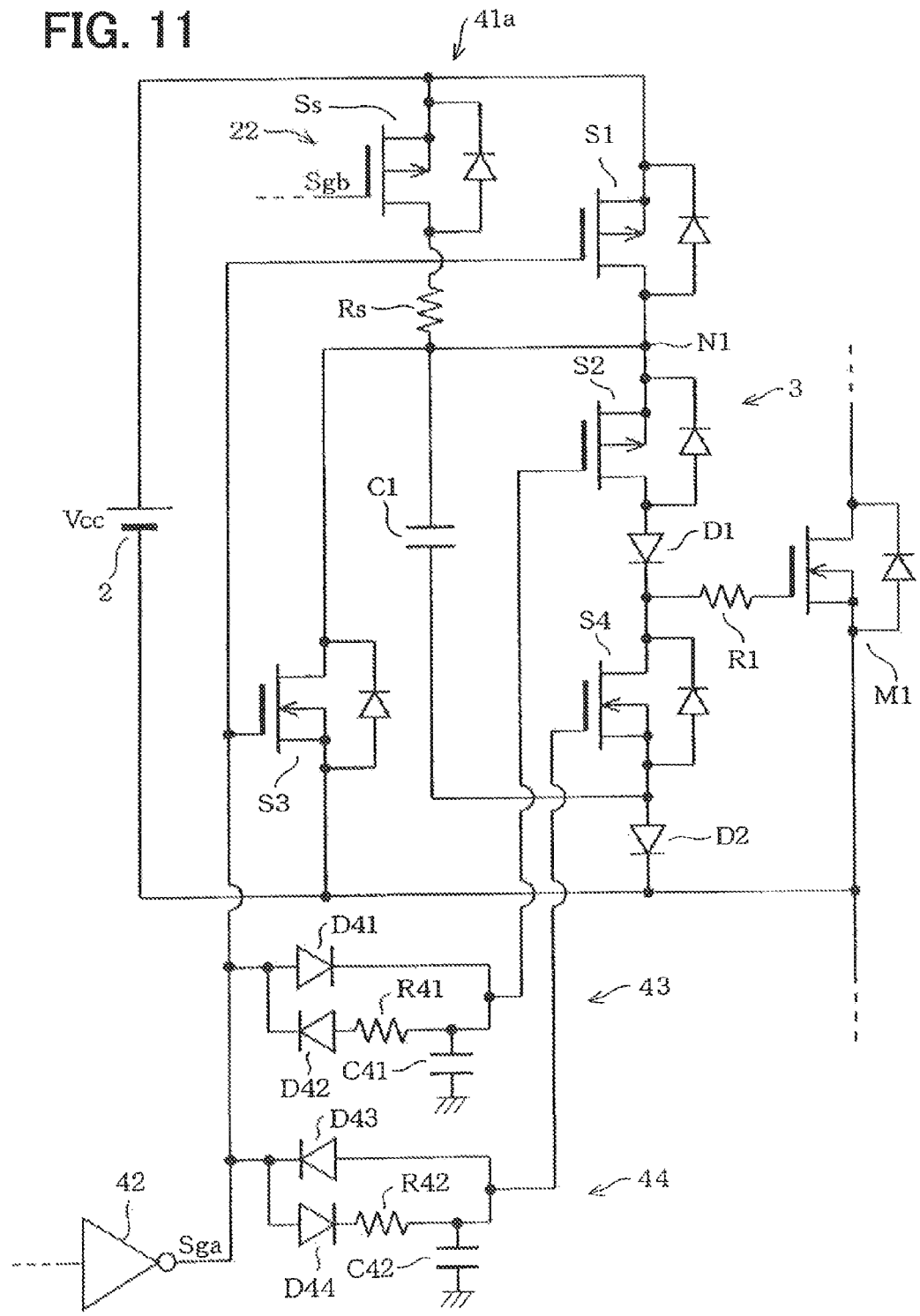
FIG. 11 is a diagram showing a driving circuit of a modification of the fifth embodiment of the present disclosure, in which a delay circuit is added.

The technique of delaying a gate signal may not be limited to only the delay by the CR circuit shown in FIG. 11. For example, the technique in which inverter circuits and the like are cascaded in multistage for the delay by a time in response to the number of the stages can be used. When the gate signal Sga is generated in synchronization with a predetermined clock (in case of clock synchronization), the technique of delaying the gate signal Sga by the predetermined clock can also be used. It is noted that a way of separately generating gate signals for driving the switches S1 and S3 and gate signals for driving the switches S2 and S4 can also be certainly used.

Sixth Embodiment

Figure 12:
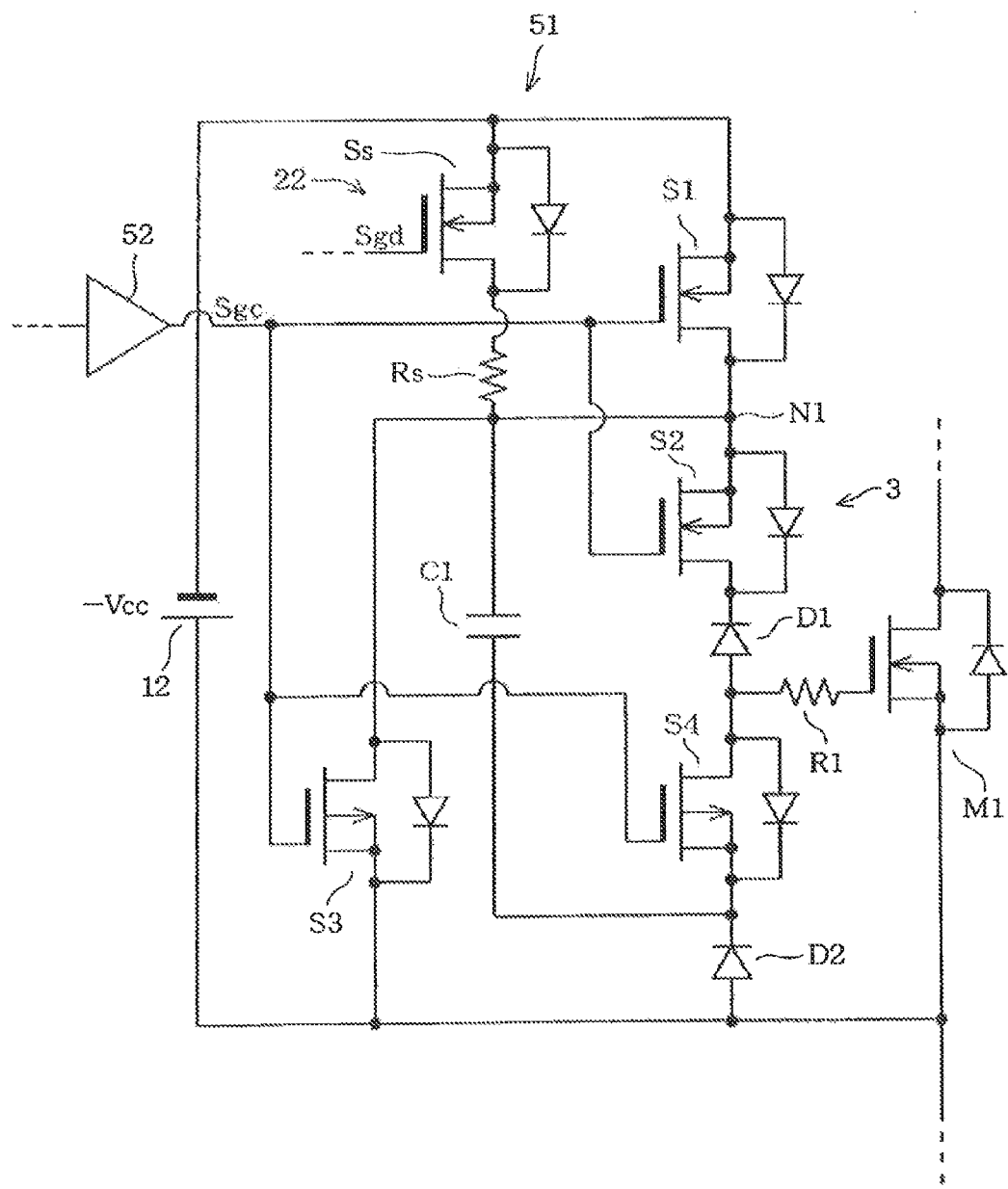
FIG. 12 is a diagram showing a driving circuit of a sixth embodiment of the present disclosure.

A sixth embodiment of the present disclosure is hereafter described with reference to FIGS. 12 and 13. A driving circuit 51 of the present embodiment corresponds to the driving circuit 31 of the fourth embodiment from which the diode D3 is omitted. As shown in FIG. 12, the switches S1 and S2 are N channel MOSFETs. The source of the switch S1 is coupled to the low voltage side output terminal of the driving power supply 12. The drain of the switch S1 and the source of the switch S2 are coupled to the node N1. The drain of the switch S2 is coupled to the cathode of the diode D1.

The switches S3 and S4 are P channel MOSFETs. The drain of the switch S3 is coupled to one terminal of the capacitor C1. The source of the switch S3 is coupled to the high potential side output terminal of the driving power supply 12. The drain of the switch S4 is coupled to the gate of the semiconductor device M1 via the resistor R1. The source of the switch S4 is coupled to the cathode of the diode D2.

The gate driver 52 outputs a gate signal Sgc based on a control signal provided from a control circuit which is not illustrated. The gate signal Sgc is provided to the gates of the switches S1 to S4. That is, the switches S1 to S4 are opened and closed by the common gate signal Sgc. Specifically, when the gate signal Sgc is at H level (0 V), the switches S1 and S2 are turned on (closed), and the switches S3 and S4 are turned off (opened). When the gate signal Sgc is at L level (voltage −Vcc), the switches S1 and S2 is turned off (opened), and the switches S3 and S4 are turned on (closed).

The switch Ss that forms the startup circuit 22 is an N channel MOSFET. The source of the switch Ss is coupled to the low voltage side output terminal of the driving power supply 12. The drain of the switch Ss is coupled to one terminal of the capacitor C1 via the resistor Rs. A gate signal Sgd based on a control signal provided from the control circuit, which is not illustrated, is provided to the gate of the switch Ss. That is, the switch Ss is opened and closed by the gate signal Sgd. Specifically, the switch Ss is turned on when the gate signal Sgd is at H level (closed), and turned off (opened) when the gate signal Sgd is at L level.

The same effect as the fifth embodiment is obtained by the driving circuit 51 of the present embodiment. The same modification as the fifth embodiment is possible in the driving circuit 51 of the present embodiment, as in a driving circuit 51a shown in FIG. 13. A delay circuit 53 includes diodes D51, D52, a resistor R51, and a capacitor C51. The anode of the diode D51 and the cathode of the diode D52 are commonly coupled to the gate of the switch S2. The anode of the diode D52 is grounded via the capacitor C51, and coupled to the output terminal of the gate driver 52 via the resistor R51. The cathode of the diode D51 is coupled to the output terminal of the gate driver 52. With such a structure, the delay circuit 53 provides, to the gate of the switch S2, a delay gate signal to delay the timing from L level to H level by a predetermined time relative to the gate signal Sgc. The above predetermined time is defined by a time constant of a CR circuit including the resistor R51 and the capacitor C51.

A delay circuit 54 includes diodes D53, D54, a resistor R52, and a capacitor C52. The cathode of the diode D53 and the anode of the diode D54 are commonly coupled, and coupled to the gate of the switch S4. The cathode of the diode D54 is grounded via the capacitor C52, and coupled to the output terminal of the gate driver 52 via the resistor R52. The anode of the diode D53 is coupled to the output terminal of the gate driver 52. With such a structure, the delay circuit 54 provides, to the gate of the switch S4, a delay gate signal to delay the timing from H level to L level by a predetermined time relative to the gate signal Sgc. The above predetermined time is defined by a time constant of a CR circuit including the resistor R52 and the capacitor C52. It is noted that the technique of delaying the gate signal Sgc is not limited to only the delay by the CR circuit shown in FIG. 13, in a manner similar to the fifth embodiment.

Seventh Embodiment

A seventh embodiment of the present disclosure is hereafter described with reference to FIG. 14. A driving circuit 61 of the present embodiment corresponds to the driving circuit 1 of the first embodiment from which the switch S2 is omitted (the driving circuit 1b shown in FIG. 4). Such a structure also obtains an effect in integration of a circuit, in a manner similar to the fifth embodiment. Additionally, the number of MOSFETs (semiconductor switches) that form the driving circuit 61 of the present embodiment may be three. Therefore, according to the driving circuit 61 of the present embodiment, a main effect of each above embodiment can be obtained by the simpler circuit.

Additionally, the delay circuit 44 (or a delay circuit having an equivalent function thereto) shown in FIG. 11 may be added to the driving circuit 61 of the present embodiment. As a result, at the head of the period B, it becomes possible to close the switch S3 before the switch S4 is closed, and thus an effect that the semiconductor device M1 can be turned off more rapidly is obtained.

Eighth Embodiment

An eighth embodiment of the present disclosure is hereafter described with reference to FIG. 15. A driving circuit 71 of the present embodiment corresponds to the driving circuit 11 of the second embodiment from which the switch S2 is omitted. An effect that such a structure is also very advantageous in integration of a circuit is obtained, in a manner similar to the fifth embodiment. Additionally, the number of MOSFETs (semiconductor switches) that forms the driving circuit 71 of the present embodiment may be three. Therefore, according to the driving circuit 71 of the present embodiment, a main effect of each embodiment mentioned above can be obtained by the simpler circuit.

Figure 13:
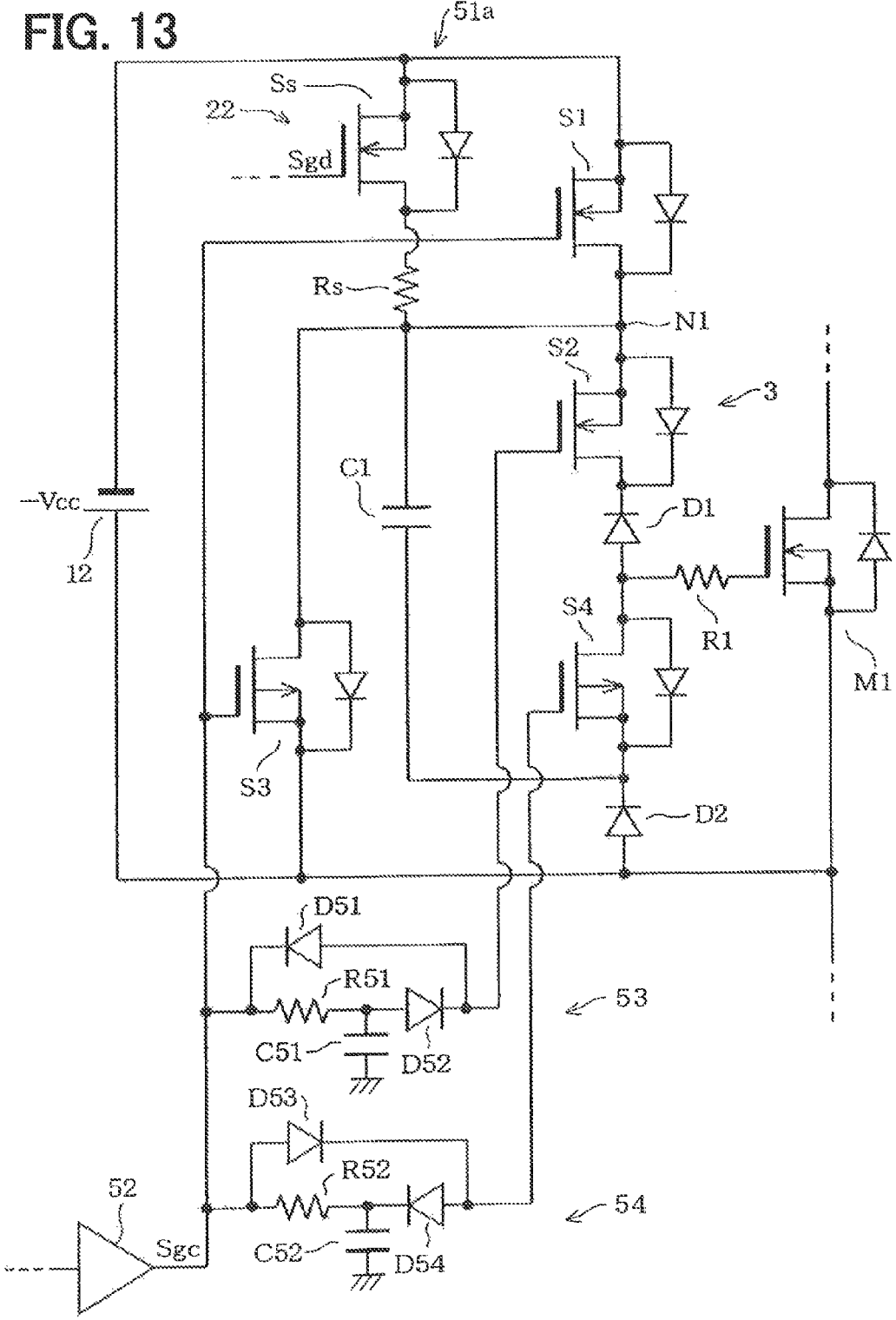
FIG. 13 is a diagram showing a driving circuit of a modification of the sixth embodiment of the present disclosure, in which a delay circuit is added.

The delay circuit 54 (or a delay circuit having an equivalent function thereto) shown in FIG. 13 may be added to the driving circuit 71 of the present embodiment. As a result, in the head of the period B, it becomes possible to close the switch S3 before the switch S4 is closed, and thus an effect that the semiconductor device M1 can be turned off more rapidly is obtained.

Ninth Embodiment

A ninth embodiment of the present disclosure is hereafter described with reference to FIGS. 16 to 19. In each above embodiment, a diode, which is a rectifying device, is used as the fifth semiconductor device and the sixth semiconductor device. As mentioned above, an effect that the circuit area can be small by use of a diode is obtained. However, in circuitry in which a diode is provided in integration of a driving circuit, the following problem occurs. That is, there are various types of processes for semiconductor integration, also including a process of making diodes easily. However, the processes are special in many cases. When such a process is added, the cost becomes high by the addition.

Even in a normal CMOS process, it is possible to make a diode. However, only a diode whose one terminal is coupled to a stable potential (GND, power supply) can be made without problem. When a diode (floating diode) whose either terminal is not coupled to a stable potential is made, a parasitic transistor is made. The operation of the parasitic transistor disturbs the operation of the diode.

From such a situation, use of a structure using MOSFETs as any one of or both of the fifth semiconductor device and the sixth semiconductor can be considered. The structure using MOSFETs instead of diodes has a larger overall size because a size of a MOSFET is larger than that of a diode. However, cost reduction can be made because no process is added.

FIGS. 16 to 19 show concrete examples of driving circuits structured without diodes. It is noted that the driving circuits of FIGS. 16 to 19 are intended to be especially designed to be integrated (to be an integrated circuit). Therefore, in FIGS. 16 to 19, body diodes (parasitic diodes) in the MOSFETs that form the driving circuits are not illustrated.

Figure 16:
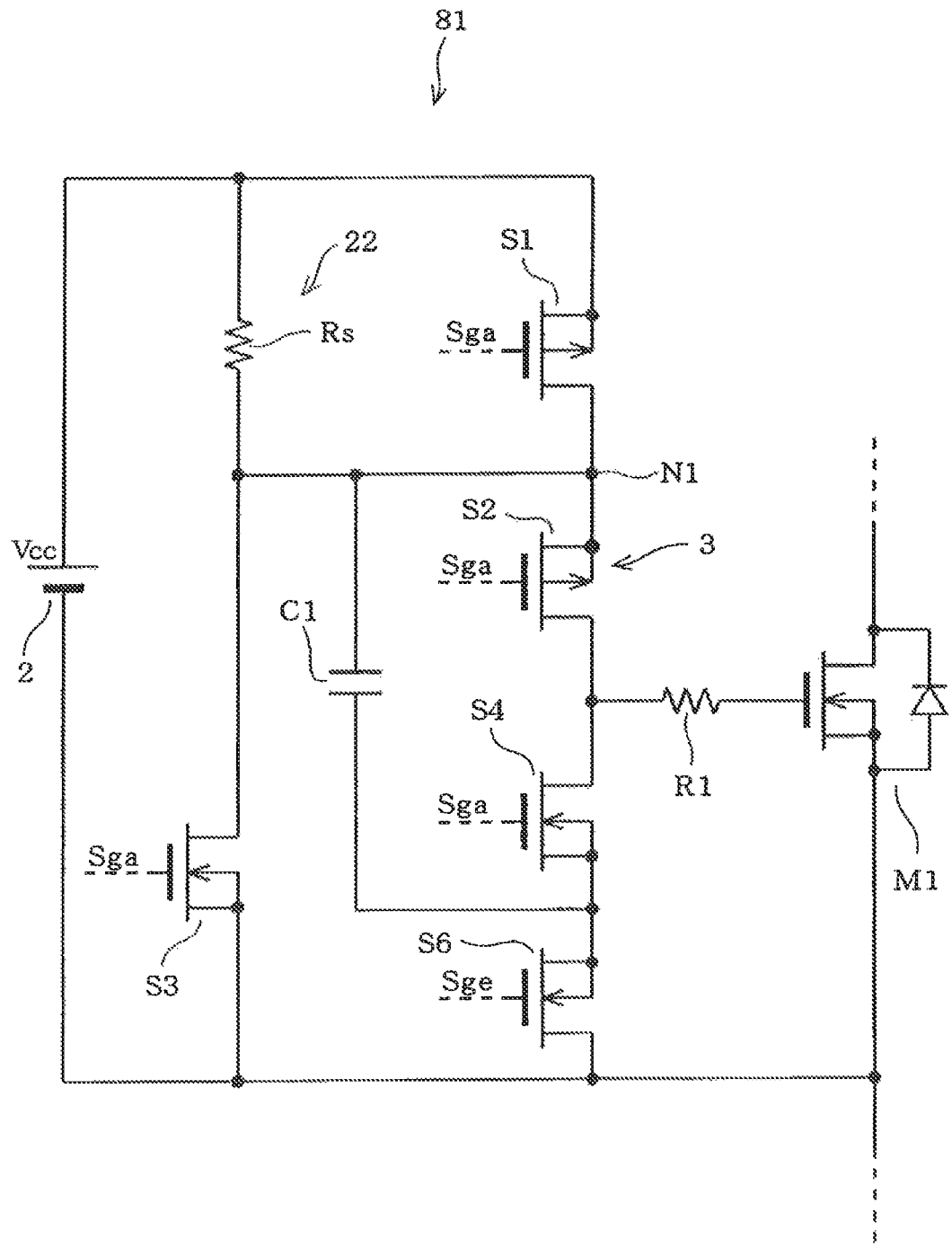
FIG. 16 is a diagram showing a driving circuit of a ninth embodiment of the present disclosure.

A driving circuit 81 shown in FIG. 16 is different from the driving circuit 41 of the fifth embodiment, e.g., in that the switch Ss of the startup circuit 22 is omitted, that the diode D1 of the second semiconductor device 3 is omitted, and that a switch S6 is provided instead of the diode D2. In this case, the resistor Rs is coupled between the high potential side output terminal of the driving power supply 2 and the node N1. The drain of the switch S2 is coupled to the drain of the switch S4.

The switch S6 (corresponding to the semiconductor switch) is an N channel MOSFET. The source of the switch S6 is coupled to the source of the switch S4. The drain of the switch S6 is coupled to the low voltage side output terminal of the driving power supply 2.

Illustration of the gate driver 42 is omitted in FIG. 16. The switches S1 to S4 are opened and closed by the common gate signal Sga outputted from the gate driver 42, as in the structure of FIG. 10. The gate signal Sge based on a control signal provided from a control circuit, which is not illustrated, is provided to the gate of the switch S6. That is, the switch S6 is opened and closed by the gate signal Sge. The switch S6 is turned on and off in synchronization with the switches S1 and S2. Therefore, the switch S6 is turned on (closed) in the period A, and turned off in the period B (opened).

According to the above structure, the switch S6 functions in the same manner as the diode D2. That is, in the period A, by closing the S6, the capacitor C1 is coupled to the driving power supply 2 in parallel via the switches S1 and S6. Therefore, the capacitor C1 is charged to the voltage Vcc in the period A. Additionally, in the period B, by opening the switch S6, the electric charge of the capacitor C1 is prevented from being discharged via the path of "the positive electrode side→the switch S3 that has been turned on→the negative electrode side." It is noted that the delay circuits 43 and 44 (or delay circuits having equivalent functions thereto) shown in FIG. 11 may be added to the driving circuit 81.

Figure 17:
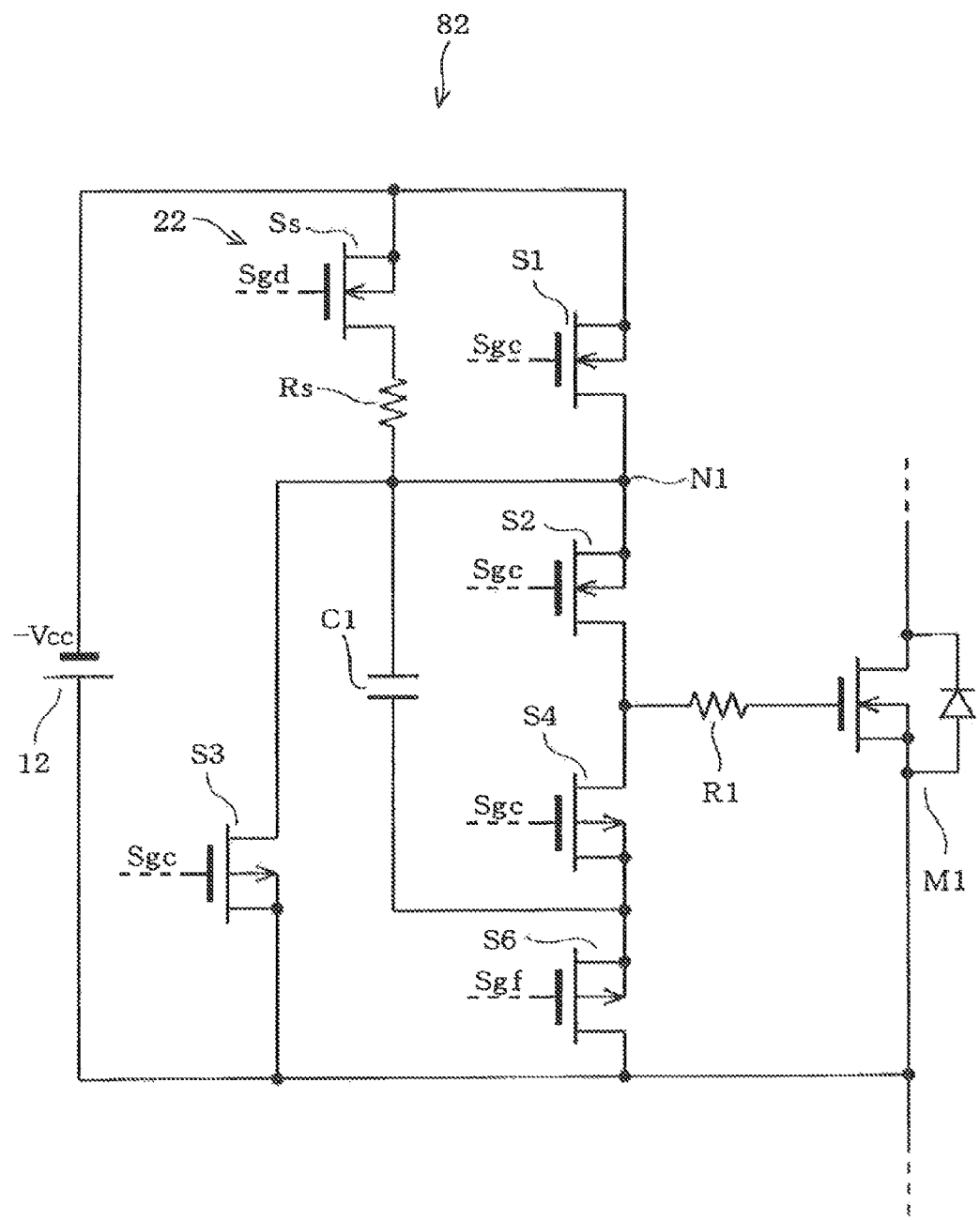
FIG. 17 is a diagram showing a driving circuit of a modification of the ninth embodiment.

A driving circuit 82 shown in FIG. 17 is different from the driving circuit 51 of the sixth embodiment, e.g., in that the diode D1 of the second semiconductor device 3 is omitted and that the switch S6 is provided instead of the diode D2. In this case, the drain of the switch S2 is coupled to the drain of the switch S4. The switch S6 is a P channel MOSFET. The source of the switch S6 is coupled to the source of the switch S4. The drain of the switch S6 is coupled to the high potential side output terminal of the driving power supply 12.

It is noted that, although the gate driver 52 is not shown in FIG. 17, the switches S1 to S4 are opened and closed by the common gate signal Sgc outputted from the gate driver 52, as in the structure of FIG. 12. A gate signal Sgf based on a control signal provided from the control circuit, which is not illustrated, is provided to the gate of the switch S6. That is, the switch S6 is opened and closed by the gate signal Sgf. The switch S6 is turned on when the switch S1 or switch Ss is on, and is turned off otherwise. Therefore, the switch S6 is turned on (closed) in the period A, and turned off (opened) in the period B.

According to the above structure, the switch S6 functions in the same manner as the diode D2, as in the driving circuit 81 shown in FIG. 16. It is noted that the delay circuits 53 and 54 (or delay circuits having an equivalent function thereto) shown in FIG. 13 may be added to the driving circuit 82.

Figure 18:
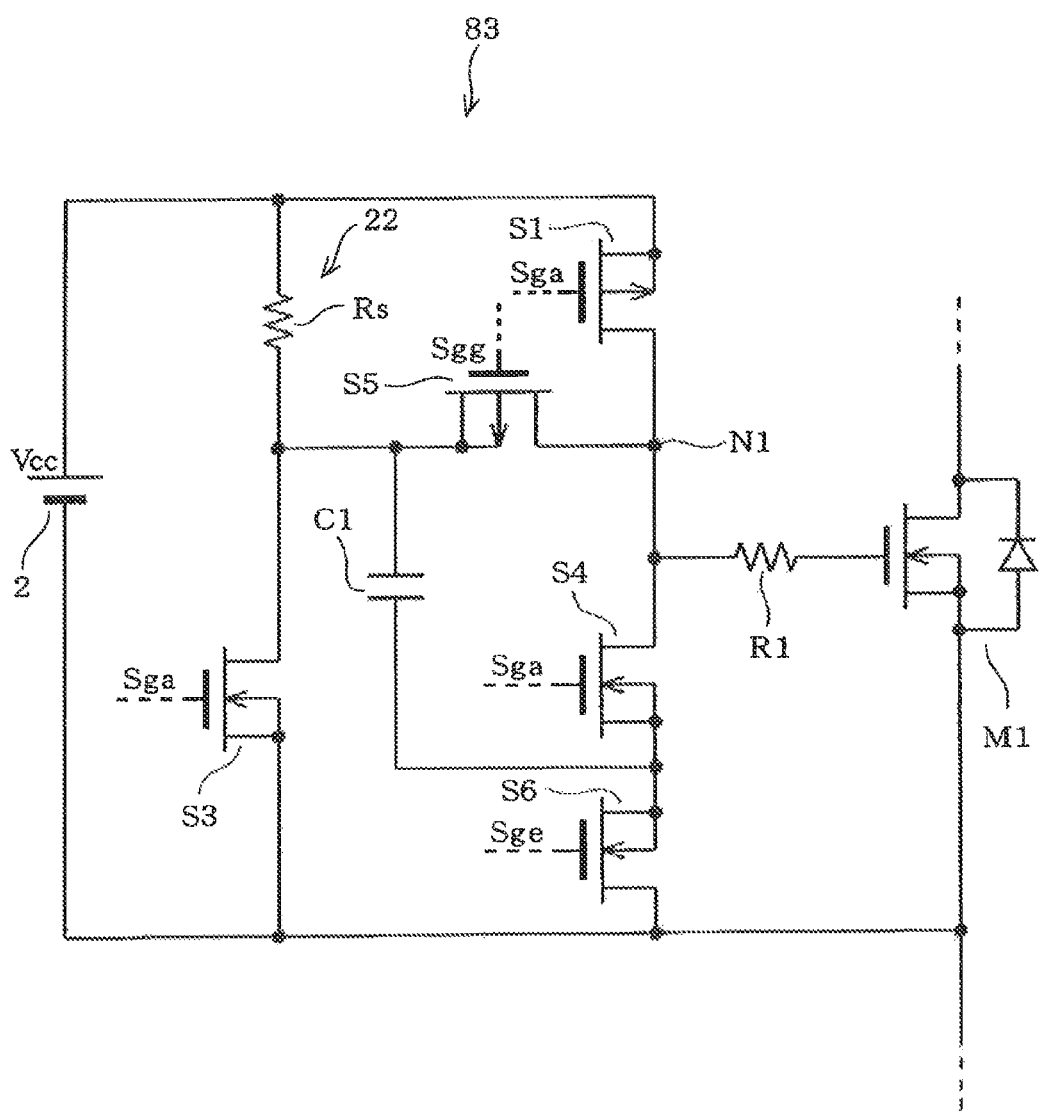
FIG. 18 is a diagram showing a driving circuit of another modification of the ninth embodiment.

A driving circuit 83 shown in FIG. 18 is different from the driving circuit 61 of the seventh embodiment, e.g., in that the startup circuit 22 is added, that the second semiconductor device 3 (=diode D1) is omitted, that the switch S6 is provided instead of the diode D2, that the switch S5 is provided instead of the diode D3, and that the resistor R2 is omitted.

In the above modification, a reason for the omission of the diode D1 is as follows. That is, when a transition to the period B (the second state) (turn-on of the switches S3 and S4) is performed sufficiently rapidly, a charge amount that flows from the control terminal (gate) to current opening-and-closing terminal (source) of the semiconductor device M1 via the switch S3 transitionally can be considered to be small enough. When the above charge amount is small enough, a negative effect that a voltage of the control terminal is drawn to 0 V becomes small even when there is no rectification by the diode D1, namely even when the diode D1 is omitted. Therefore, in the structure in which the transition to the second state can be performed at a rate enough to obtain such an action (action to make the negative effect small), the diode D1 may be omitted.

Since the structure of FIG. 18 is made on the assumption that the transition to the period B is performed at a rate enough to obtain the above action, the diode D1 is omitted. It is noted that, also in each above embodiment, the diode D1 can be omitted when the structure is premised on the transition to the period B at a rate enough to obtain the above action.

In this case, the startup circuit 22 includes the resistor Rs coupled between the high potential side output terminal of the driving power supply 2 and one terminal of the capacitor C1. The drain of the switch S4 is coupled to the node N1. The switch S6 is an N channel MOSFET. The source of the switch S6 is coupled to the source of the switch S4. The drain of the switch S6 is coupled to the low voltage side output terminal of the driving power supply 2. The switch S5 (corresponding to the semiconductor switch) is a P channel MOSFET. The source of the switch S5 is coupled to one terminal of the capacitor C1. The drain of the switch S5 is coupled to the node N1.

Figure 14:
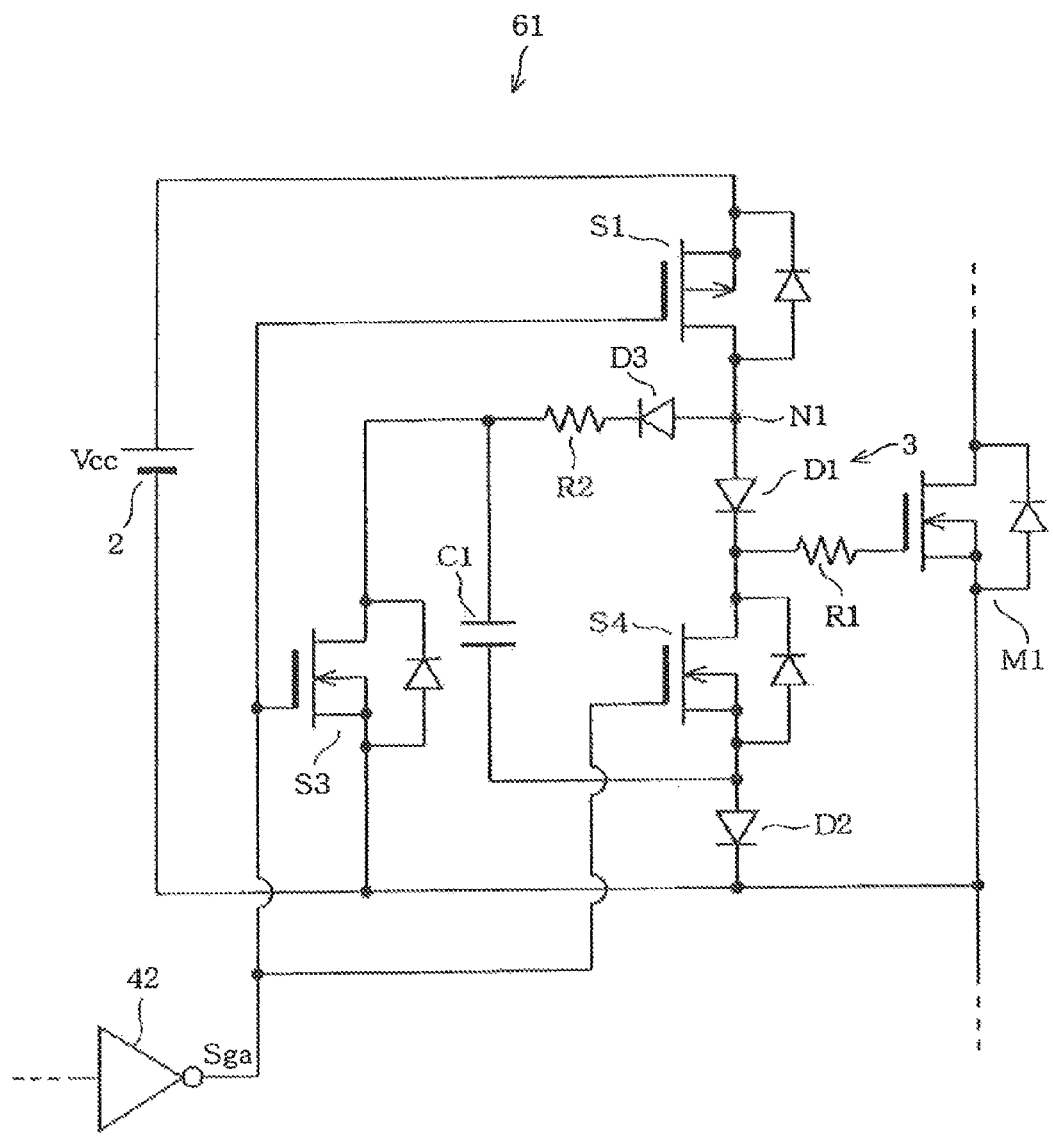
FIG. 14 is a diagram showing a driving circuit of a seventh embodiment of the present disclosure.

It is noted that, although the gate driver 42 is not shown in FIG. 18, the switch S1, S3, and S4 are opened and closed by the common gate signal Sga outputted from the gate driver 42 as in the structure of FIG. 14. A gate signal Sgg based on a control signal provided from a control circuit, which is not illustrated, is provided to the gate of the switch S5. That is, the switch S5 is opened and closed by the gate signal Sgg. A gate signal Sge based on a control signal provided from the control circuit, which is not illustrated, is provided to the gate of the switch S6. That is, the switch S6 is opened and closed by the gate signal Sge. The switches S5 and S6 are turned on and off in synchronization with the switch S1. Therefore, the switches S5 and S6 are turned on (closed) in the period A, and turned off (opened) in the period B.

According to the above structure, the switch S6 functions in the same manner as the diode D2, and the switch S5 functions in the same manner as the diode D3. That is, in the period A, by closing the S5 and S6, the capacitor C1 is coupled to the driving power supply 2 in parallel via the switches S1, S5, and S6. Therefore, the capacitor C1 is charged to the voltage Vcc in the period A.

Additionally, in the period B, by opening the switch S5, the electric charge of the capacitor C1 is prevented from being discharged via the path of "the positive electrode side→the switch S4 that has been turned on→the negative electrode side." Further, in the period B, by opening the switch S6, the electric charge of the capacitor C1 is prevented from being discharged via the path of "the positive electrode side→the switch S3 that has been turned on→the negative electrode side." It is noted that the delay circuit 44 (or a delay circuit having the equivalent function thereto) shown in FIG. 11 may be added to the driving circuit 83.

Figure 19:
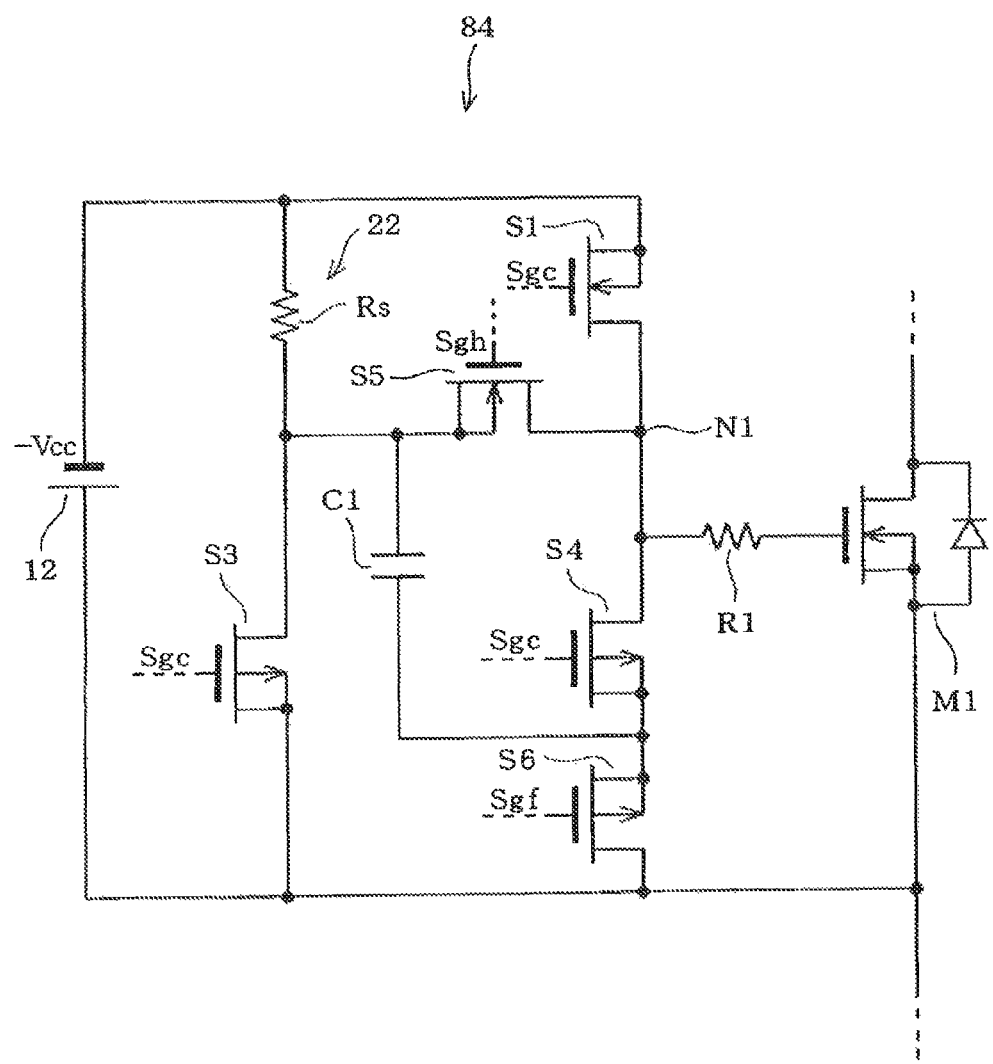
FIG. 19 is a diagram showing a driving circuit of another modification of the ninth embodiment.

A driving circuit 84 shown in FIG. 19 is different from the driving circuit 71 of the eighth embodiment, e.g., in that the startup circuit 22 is added, that the second semiconductor device 3 (=diode D1) is omitted, that the switch S6 is provided instead of the diode D2, that the switch S5 is provided instead of the diode D3, and that the resistor R2 is omitted. The diode D1 is omitted for the same reason as the case of the driving circuit 83 shown in FIG. 18. In this case, the startup circuit 22 includes the resistor Rs coupled between the low voltage side output terminal of the driving power supply 2 and one terminal of the capacitor C1.

The drain of the switch S4 is coupled to the node N1. The switch S6 is a P channel MOSFET. The source of the switch S6 is coupled to the source of the switch S4. The drain of the switch S6 is coupled to the high potential side output terminal of the driving power supply 2. The switch S5 is an N channel MOSFET. The source of the switch S5 is coupled to one terminal of the capacitor C1. The drain of the switch S5 is coupled to the node N1.

Figure 15:
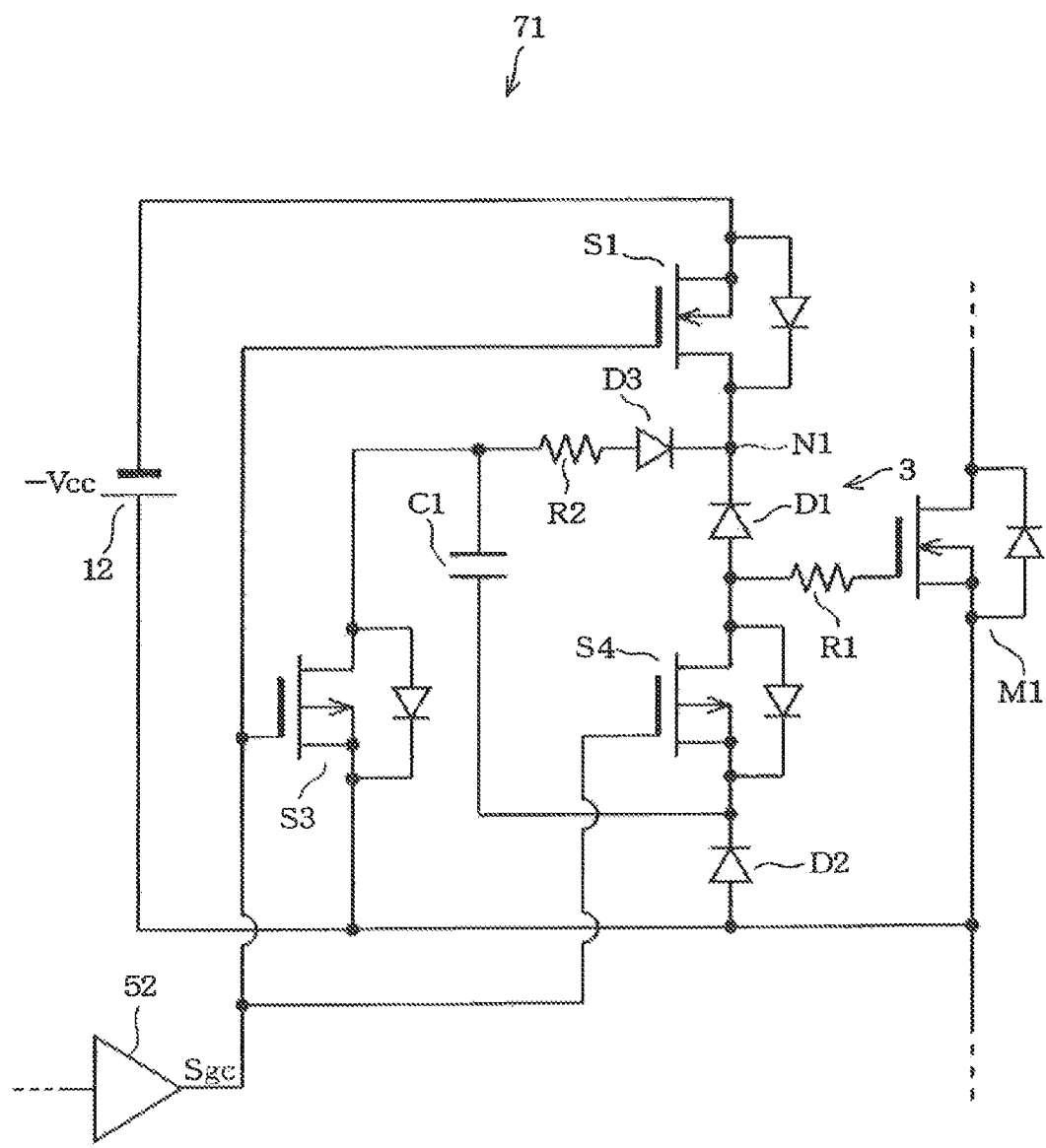
FIG. 15 is a diagram showing a driving circuit of an eighth embodiment of the present disclosure.

It is noted that, although the gate driver 52 is not shown in FIG. 19, the switch S1, S3, and S4 are opened and closed by the common gate signal Sgc outputted from the gate driver 52 as in the structure of FIG. 15. A gate signal Sgh based on a control signal provided from the control circuit, which is not illustrated, is provided to the gate of the switch S5. That is, the switch S5 is opened and closed by the gate signal Sgh. Additionally, the gate signal Sgf based on a control signal provided from the control circuit, which is not illustrated, is provided to the gate of the switch S6. That is, the switch S6 is opened and closed by gate signal Sgf. The switches S5 and S6 are turned on and off in synchronization with the switch S1. Therefore, the switches S5 and S6 are turned on (closed) in the period A, and turned off (opened) in the period B.

According to the above structure, the switch S6 functions in the same manner as the diode D2, and the switch S5 functions in the same manner as the diode D3. The delay circuit 54 (or a delay circuit having the equivalent function thereto) shown in FIG. 13 may be added to the driving circuit 84.

As explained above, the main effect of each above embodiment can be obtained also in the structure of the present embodiment that uses the MOSFETs as one or both of the fifth semiconductor device and sixth semiconductor device. Further, according to the structure of the present embodiment, since no diode is used, it is not necessary to add a special process, and an effect that cost reduction is achieved by omission of such a process.

It is noted that, as mentioned above, the diode (D2) whose one terminal is coupled to the stable potential can be made in a relatively trouble-free manner by use of a substrate on an integrated circuit even in a normal CMOS process. Therefore, in the structure using a MOSFET as the fifth semiconductor device and using a diode as the sixth semiconductor device, an effect to reduce the cost by omission of the process and an effect to reduce the circuit area by use of the diode as the sixth semiconductor device are both obtained.

The driving circuit 83 of FIG. 18 uses an N channel MOSFET as the fifth semiconductor device. The driving circuit 84 of FIG. 19 uses a P channel MOSFET as the fifth semiconductor device. However, when a MOSFET is used as the fifth semiconductor device, a type (P channel or N channel) of the MOSFET may be not limited to ones shown in FIGS. 18 and 19. For example, when a polarity of the parasitic diode is not changed, the fifth semiconductor device may be structured using an N channel MOSFET in the driving circuit 83 of FIG. 18, and the fifth semiconductor device may be structured using a P channel MOSFET in the driving circuit 84 of FIG. 19.

Additionally, also when a MOSFET is used as the sixth semiconductor device, a type of the MOSFET may be not limited to ones shown in FIGS. 16 to 19, as in the fifth semiconductor device. For example, when appropriate voltage potentials can be provided to signals Sge, Sgf, the sixth semiconductor device may be structured using a P channel MOSFET in the driving circuit 83 of FIG. 18, and the six semiconductor device may be structured using an N channel MOSFET in the driving circuit 84 of FIG. 19. Further, in the above structure, the switches S5 and S6 may be not limited to MOSFETs, and any semiconductor switch having a function to open and close a current in one direction can be applied appropriately.

Tenth Embodiment

Figure 20:
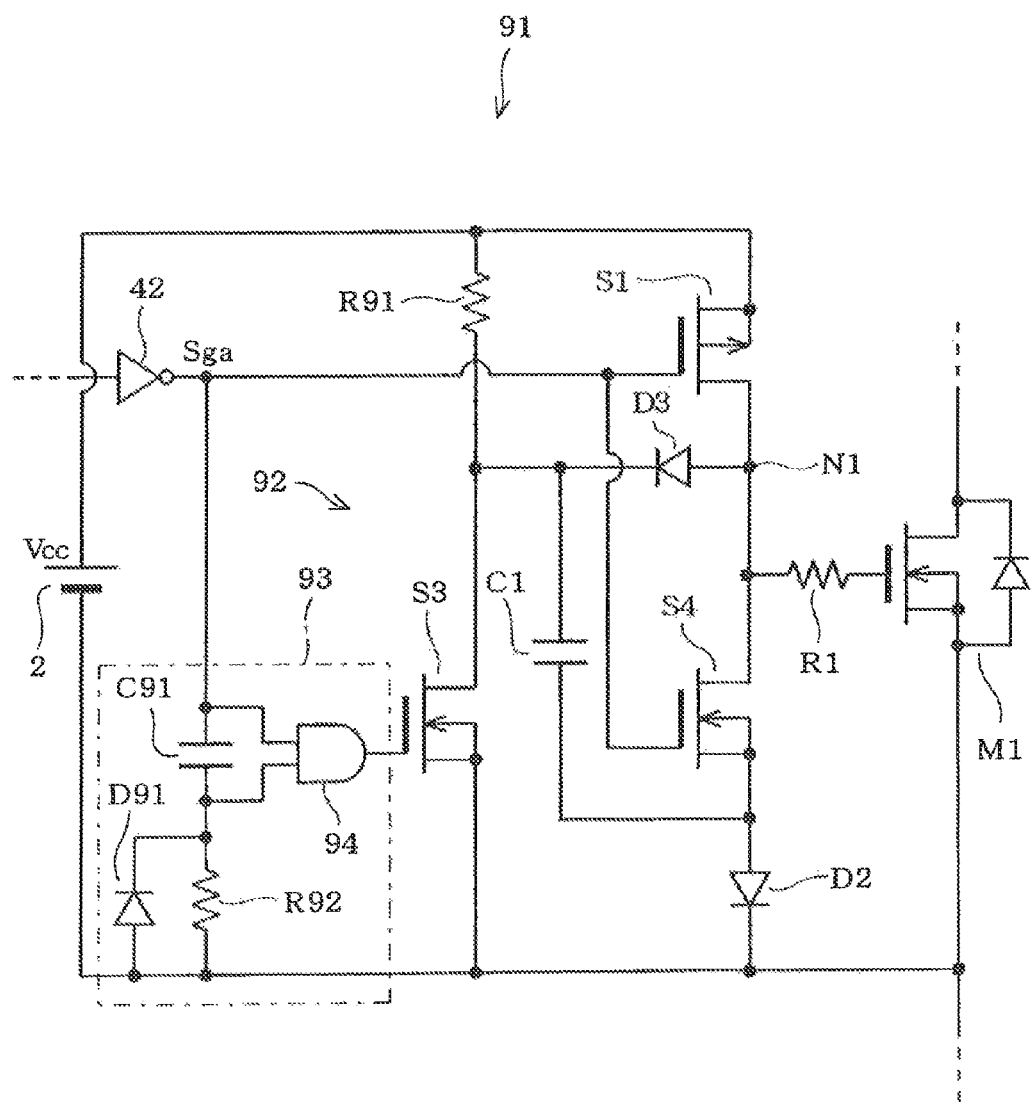
FIG. 20 is a diagram showing a driving circuit of a tenth embodiment of the present disclosure.

A tenth embodiment of the present disclosure is hereafter described with reference to FIGS. 20 and 21. As shown in FIG. 20, a driving circuit 91 of the present embodiment is different from the driving circuit 61 of the seventh embodiment, e.g., in that the startup circuit 92 is added, that the second semiconductor device 3 (=diode D1) is omitted, and that the resistor R2 is omitted. It is noted that the diode D1 is omitted for the same reason as the case of the driving circuit 83 shown in FIG. 18. In this case, the startup circuit 92 includes a resistor R91 coupled between the high potential side output terminal of the driving power supply 2 and the drain of the switch S3 (one terminal of the capacitor C1) and a drive control circuit 93 that controls a drive of the switch S3. The cathode of the diode D3 is coupled to one terminal of the capacitor C1. The drain of the switch S4 is coupled to the node N1.

The drive control circuit 93 includes an AND circuit 94, a capacitor C91, a resistor R92, and a diode D91. Between the output terminal of the gate driver 42 and the low voltage side output terminal of the driving power supply 2, a series circuit of the capacitor C91 and resistor R92 is coupled. Between both terminals of the resistor R92, the diode D91 is coupled to have the anode on the side of the low voltage side output terminal of the driving power supply 2. A voltage of each terminal of the capacitor C91 is inputted into the AND circuit 94. An output signal of the AND circuit 94 is provided to the gate of the switch S3. That is, the switch S3 is opened and closed by an output signal of the AND circuit 94.

Figure 21:
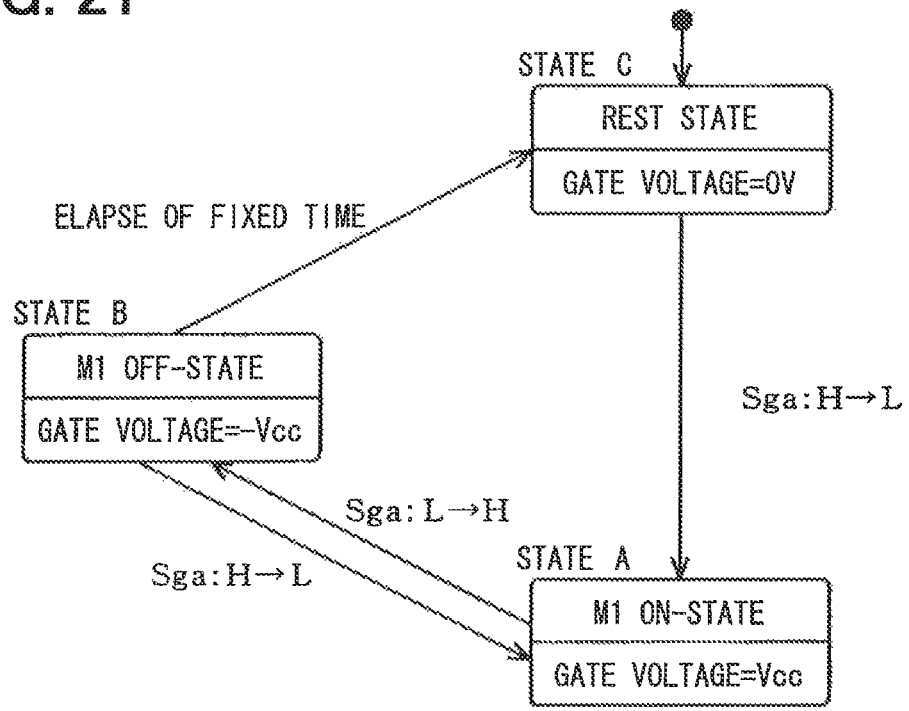
FIG. 21 is a diagram showing transition of operation states of the driving circuit in the tenth embodiment.

FIG. 21 is a state transition diagram in the above structure. In a state A, a positive voltage is applied to the gate of the semiconductor device M1 to turn on the semiconductor device M1. In a state B, a negative voltage is applied to the gate of the semiconductor device M1 to turn off the semiconductor device M1. A state C is a rest state in which zero voltage is applied to the gate of the semiconductor device M1 and the startup operation is performed to charge the capacitor C1 via the resistor R91.

In the state A, the gate signal Sga becomes L level (H→L), the switch S1 is turned on, and the switch S4 is turned off. Accordingly, the positive voltage (Vcc) is applied to the gate of the semiconductor device M1, which then enters the on-state. Since the output of the AND circuit 94 becomes L level at this time, the switch S3 is turned off. Further, at this time, the capacitor C91 is discharged via the diode D91 (voltage between the terminals of the capacitor C91=0 V).

After that, in the state B, the gate signal Sga becomes H level (L→H), the switch S1 is turned off, and the switch S4 is turned on. Since the voltage between the terminals of the capacitor C91 is 0 V at this time, voltages of the terminals of the capacitor C91 are both at the same level (H level) as the gate signal Sga. Accordingly, since the output of the AND circuit 94 becomes H level, the switch S3 is turned on. Accordingly, the negative voltage (−Vcc) is applied to the gate of the semiconductor device M1, which then enters the off-state.

Further, at this time, the capacitor C91 is charged through the resistor R92. Since the voltage between the terminals of the capacitor C91 increases as the charging progresses, a difference between one terminal voltage (output terminal side of the gate driver 42) and the other terminal voltage (resistor R92 side) thereof becomes large. Then, when the other terminal voltage decreases to a voltage determined to be at L level input in the AND circuit 94, the output of the AND circuit 94 is at L level, and the switch S3 is turned off. That is, the state B transitions to the state C.

A time from the turn-on to turn-off of the switch S3 corresponds to a fixed time in the state transition diagram of FIG. 21, and is set by a time constant defined from a capacitance value of the capacitor C91 and a resistance of the resistor R92. When the above fixed time is set to a relatively short time within the period B shown in FIG. 2, the switch S3 repeats an operation of "on"→"off" in the period B every cycle. That is, in every cycle, the second state is entered (state to apply a negative voltage to the gate) at the beginning of the period B, and then the third state is entered (a state to apply a zero voltage to the gate and to perform the startup operation). In this case, the startup operation is performed in a partial period of the off-drive period of the semiconductor device M1. In such a way, as explained also in the third embodiment, during continuously operating time, the charging current to the capacitor C1 is restricted at the start of the period of the on-drive of the semiconductor M1, and a decrease of the on-rate of the semiconductor M1 can be restricted.

On the other hand, when the above fixed time is set to a relatively long time over the period B shown in FIG. 2, the transition from the state B to state C is not performed in the normal duration of period B. That is, the startup operation is not performed. However, when the period B continues for a long time, for example, when the driving circuit 91 performs the intermittent operation, the state B transitions to the state C, and the startup operation is performed. In such a way, the on-rate of the first turn-on of the semiconductor M1 is prevented from decreasing at the return from the intermittent operation.

Eleventh Embodiment

An eleventh embodiment of the present disclosure is hereafter described with reference to FIGS. 22 to 27. In each above embodiment, the capacitor C1 is used as the electricity storage portion, which can be appropriately replaced with any device or circuit having an electricity storage function. For example, a storage battery (battery) may be used instead of the capacitor C1. Additionally, instead of the single capacitor C1, a circuit having an electricity storage function as shown in FIG. 22 may be used.

Figure 22:
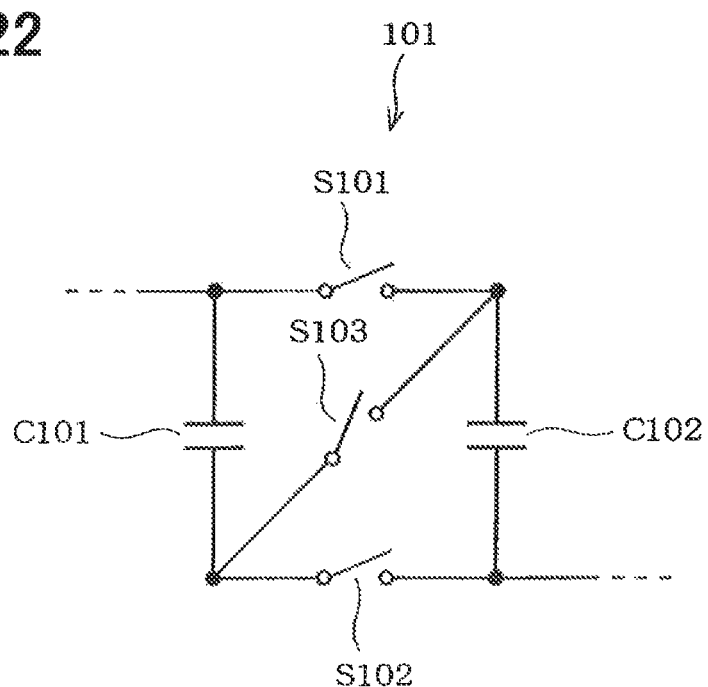
FIG. 22 is a diagram showing one example of a capacitor circuit of an eleventh embodiment of the present disclosure.

A capacitor circuit 101 (corresponding to an electricity storage portion) shown in FIG. 22 includes two capacitors C101, C102 and three switches S101 to S103 (corresponding to a topology switching portion). The switch S101 is provided to be opened and closed between one terminal of the capacitor C101 and one terminal of the capacitor C102. The switch S102 is provided to be opened and closed between the other terminal of the capacitor C101 and the other terminal of capacitor C102. The switch S103 is provided to be opened and closed between the other terminal of the capacitor C101 and one terminal of the capacitor C102. Each of the switches S101 to S103 is turned on and off by a control signal provided from a control circuit, which is not illustrated. When the capacitor C1 in the structure of each above embodiment is replaced with the capacitor circuit 101, one terminal of the capacitor C101 corresponds to one terminal of the capacitor C1, and the other terminal of the capacitor C1 corresponds to the other terminal of the capacitor C102.

With the capacitor circuit 101 having such a structure, the following function, which is unrealizable with the capacitor C1, is realizable. The example in which the driving power supply is a positive power supply is explained below. The same function can be realized also in case of a negative power supply. That is, when the on-drive of the semiconductor device M1 (the first state, the period A) is performed, the switches S101 and S102 are turned on and the switch S103 is turned off. As a result, the capacitors C101 and C102 are coupled in parallel with one another to be a parallel topology. Therefore, in the first state, the capacitor circuit 101 of the parallel topology is charged, and the capacitors C101 and C102 are both charged to the supply voltage Vcc.

Then, when the off-drive of the semiconductor device M1 (the second state, the period B) is performed, the switches S101 and S102 are turned off, and the switch S103 is turned on. As a result, the capacitors C101 and C102 are coupled in series to be a serial topology. Therefore, in the second state, the capacitor circuit 101 of the serial topology is discharged, and a sum of voltages of the capacitors C101 and C102, namely a negative voltage twice the voltage Vcc (−2·Vcc) is applied to the gate of the semiconductor device M1.

In such a way, the driving circuit that outputs a negative voltage twice the power supply of the driving power supply can be structured. Additionally, when the open and close state of each of the switches S101 to S103 at the on-drive of the semiconductor device M1 (the first state, period A) and at the off-drive of the semiconductor device M1 (the second state, period B) is reversed to the above pattern, the driving circuit that outputs a negative power supply ½ times of the voltage of the driving power supply can be structured in the second state.

The capacitor circuit 101 shown in FIG. 22 is structured to include two capacitors C101 and C102 whose topology is switched (converted) between serial coupling and parallel coupling. In such a structure, it is also possible to increase the number of stages of serial-and-parallel coupling of the capacitors. For example, as in the capacitor circuit 102 (corresponding to the electricity storage portion) shown in FIG. 23, a structure including three capacitors C101 to C103 and six switches S101 to S106 (corresponding to the topology switching portion) can be used. According to the capacitor circuit 102 of such a structure, by performing operations on the basis of the same principle as the capacitor circuit 101, the driving circuit that outputs a negative voltage three times of the driving power supply and the driving circuit that outputs a negative voltage ⅓ times of the driving power supply can be structured.

Figure 24:
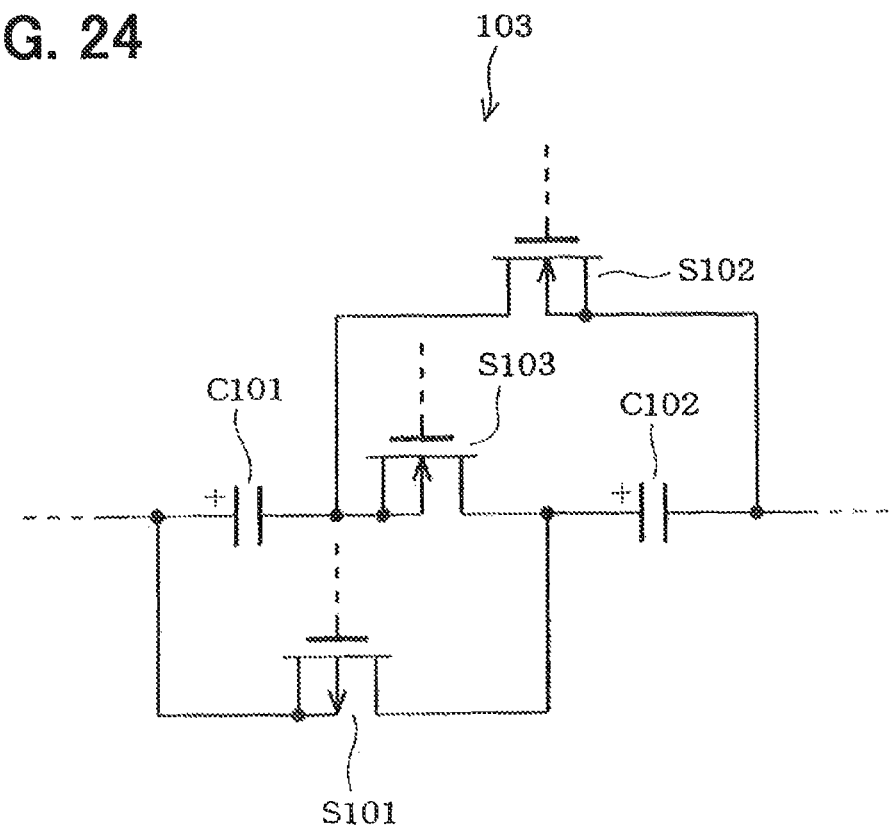
FIG. 24 is a diagram showing a concrete example of a structure of the capacitor circuit.
Figure 25:
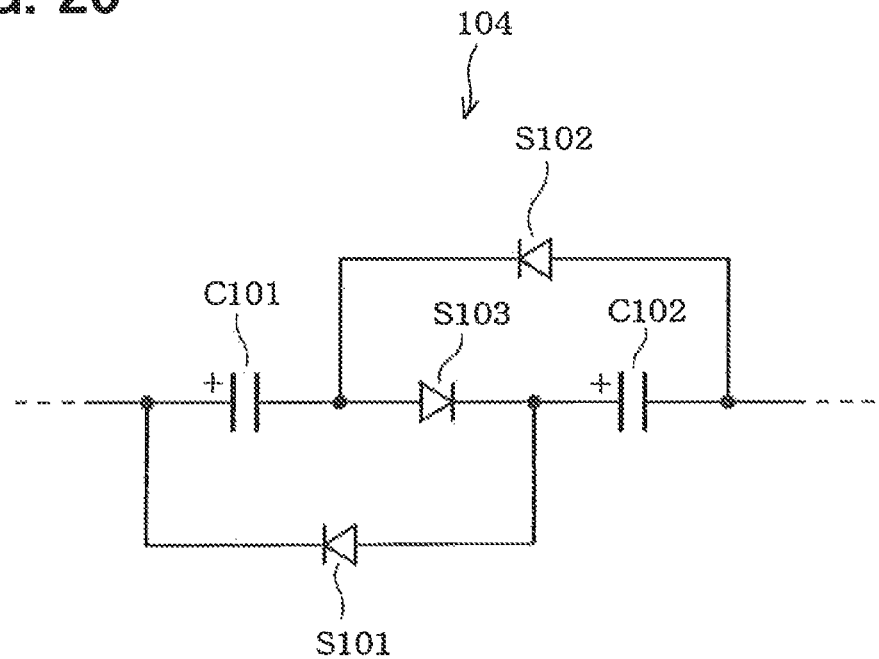
FIG. 25 is a diagram showing another concrete example of the structure of the capacitor circuit.

FIGS. 24 and 25 each show an example of a concrete structure of the capacitor circuit 101 shown in FIG. 22. The capacitor circuit 103 shown in FIG. 24 uses a P channel MOSFET as the switch S101 and uses N channel MOSFETs as the switches S102 and S103. Therefore, the capacitor circuit 103 is preferable for integration by a CMOS process. The capacitor circuit 104 shown in FIG. 25 uses diodes as the switches S101 to S103. Therefore, the capacitor circuit 104 is preferable for integration by a bipolar process. It is noted that, since the capacitor circuit 104 uses diodes as the switches S101 to S104, it can be used only when a driving circuit that outputs a negative voltage ½ times of the driving power supply is structured. However, in the capacitor circuit 104, an effect that the circuit area is reduced by use of a diode instead of a MOSFET compared to the capacitor circuit 103 shown in FIG. 24 is obtained.

Figure 23:
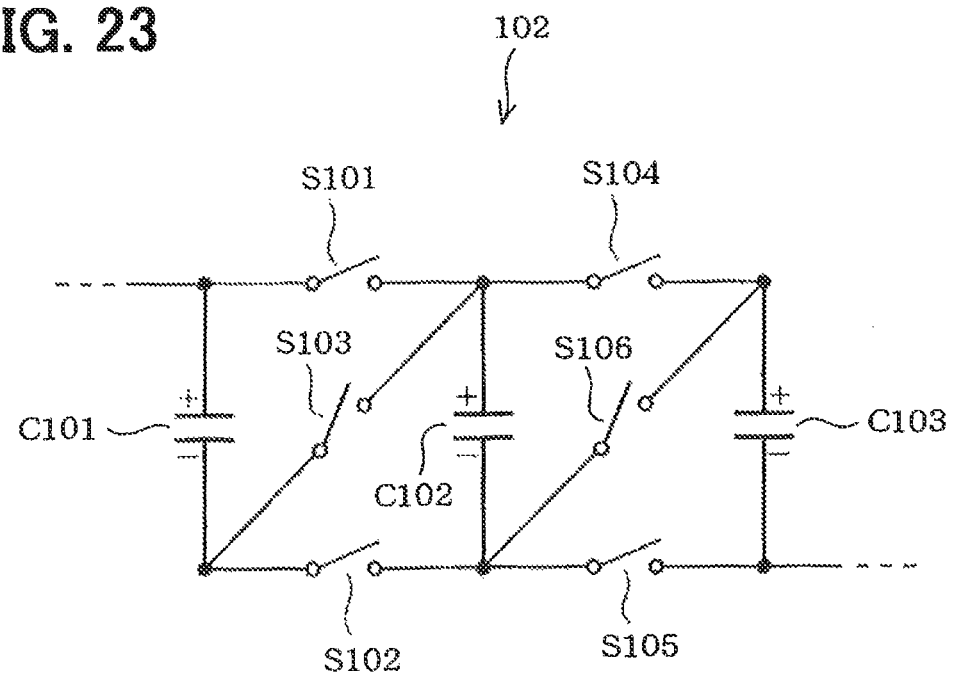
FIG. 23 is a diagram showing another example of the capacitor circuit.
Figure 26:
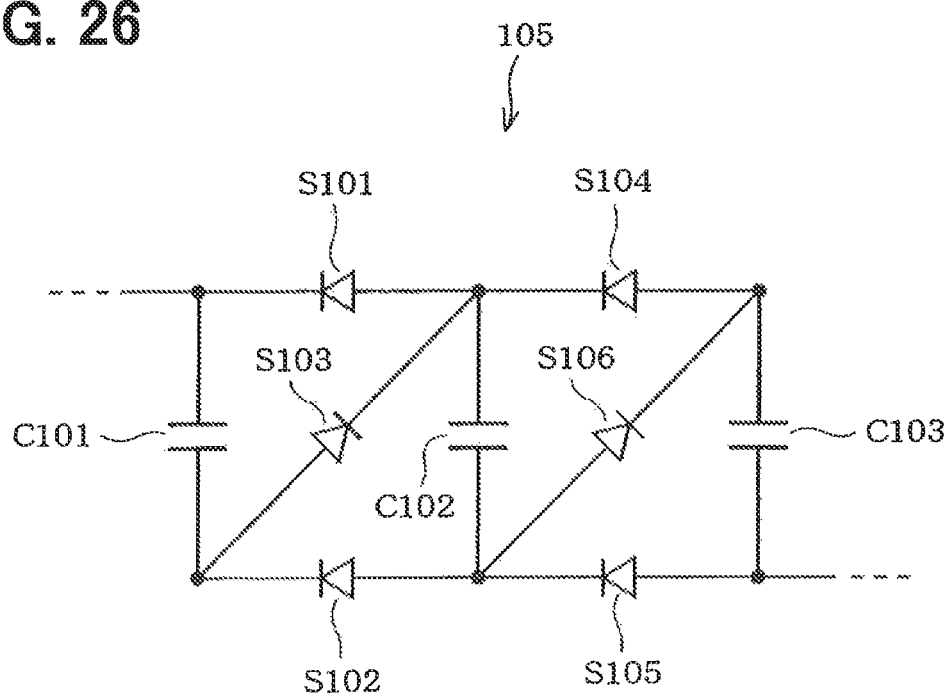
FIG. 26 is a diagram showing another concrete example of the structure of the capacitor circuit.

FIG. 26 shows an example of a concrete structure of the capacitor circuit 102 shown in FIG. 23. The capacitor circuit 105 shown in FIG. 26 uses diodes as the switches S101 to S106. Therefore, the capacitor circuit 105 is preferable for integration by a bipolar process. From the same reason as the capacitor circuit 104 shown in FIG. 25, the capacitor circuit 105 can be used only when a driving circuit that outputs a negative voltage ⅓ times of the driving power supply is structured.

Figure 27:
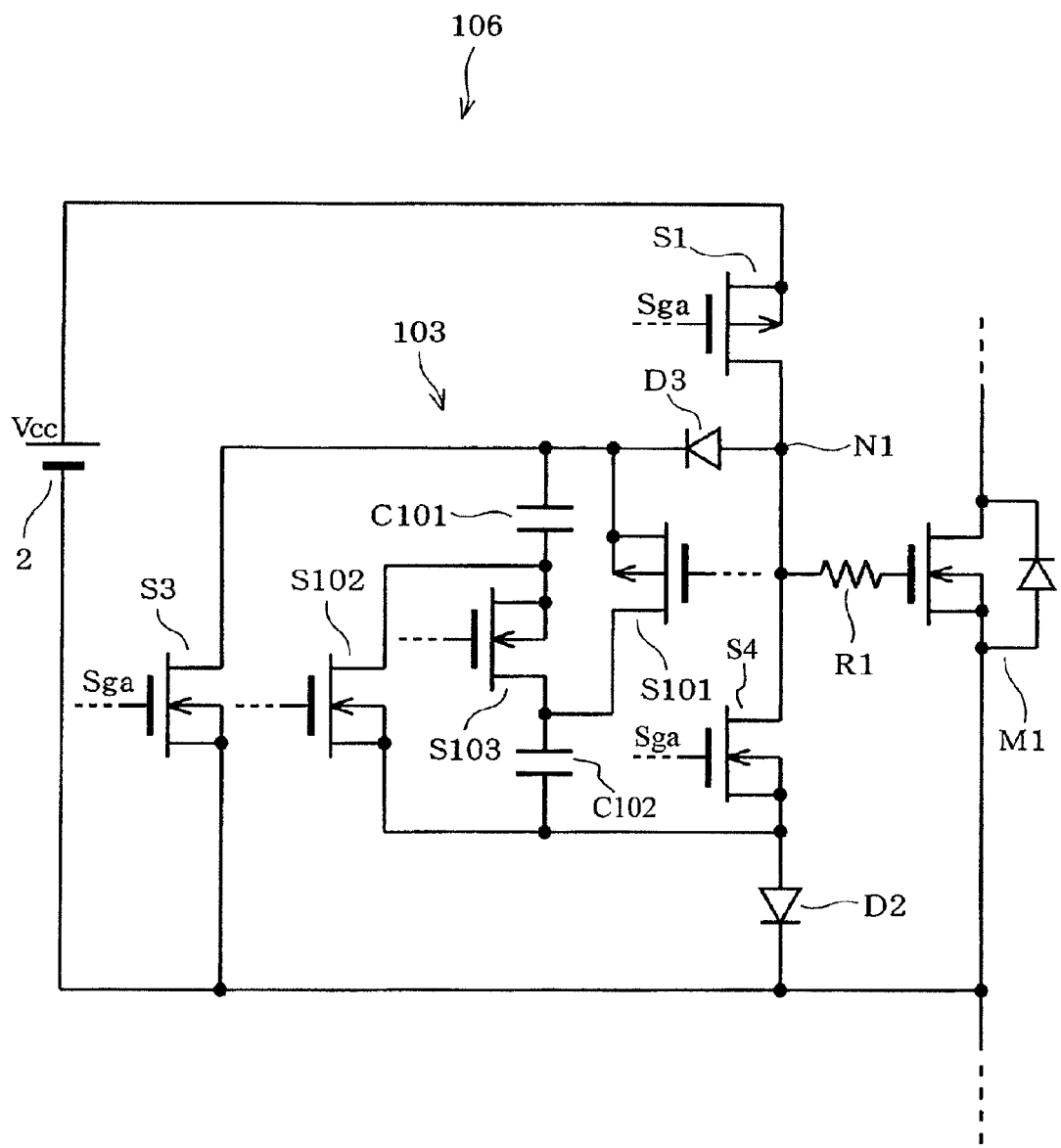
FIG. 27 is a diagram showing an example of a structure of a driving circuit using the capacitor circuit.

FIG. 27 shows one structural example of a driving circuit using the capacitor circuit 103 shown in FIG. 24 as the electricity storage portion. The driving circuit 106 shown in FIG. 27 is different from the driving circuit 41 of the fifth embodiment, e.g., in that the capacitor circuit 103 is provided instead of the capacitor C1, that the startup circuit 22 is omitted, that the diode D3 is added, and that the second semiconductor device 3 is omitted.

As explained above, according to the present embodiment using the capacitor circuit that switches serial coupling and parallel coupling of the multiple capacitors as the electricity storage portion, the following effect is obtained. That is, the driving circuit that outputs a negative voltage n times or 1/n (n is a number of stages of serial-parallel coupling of the capacitor circuit) of the driving power supply can be structured. When the driving circuit that outputs a negative voltage n times of the driving power supply is structured, an effect that noise tolerance increases at the off-drive of the semiconductor device M1 is obtained. That is, even when a switching noise is large and switching is performed rapidly, occurrence of malfunction (erroneous turn-on) can be restricted.

On the other hand, when the driving circuit that outputs a negative voltage 1/n time of the driving power supply is structured, degradation of the gate of the semiconductor device M1 can be restricted. That is, when a large negative voltage is applied to the gate, an element (gate oxide film and the like) may deteriorate depending on characteristics of the semiconductor device M1 to be driven. In such a case, with the structure that outputs a negative voltage of 1/n of the driving power supply, degradation of elements can be prevented by reducing the negative voltage while securing the positive voltage for the on-drive.

Other Embodiments

In addition, the present disclosure is not limited to each embodiment above described and illustrated on the drawings, and the following modifications or extensions are possible. The order of turning-on of the switches S1 and S2 and the order of turning-on of the switches S3 and S4 are not limited to the above ones as long as delays of the turn-on and the turn-off of the semiconductor device M1 are permissible. For example, the opening and closing control of the switches S1 to S4 is not limited to that shown in FIG. 2, but may be changed as follows. That is, a control to shift start points of on-periods of the switches S1 and S2 may be not performed. That is, the on-periods of the switches S1 and S2 may coincide with one another completely. The control to shift start points of the on-periods of the switches S3 and S4 may be not performed. That is, the on-periods of the switches S3 and S4 may coincide with one another completely. Alternatively, the start point of the switch S2 may precede the start point of the switch S1. Additionally, the start point of the switch S4 may precede the start point of the switch S3.

For example, in the structure in which the diode D3 shown in FIGS. 3, 10 to 13, FIG. 16, FIG. 17, etc. is omitted, a resistor that restricts a charging current of the capacitor C1 may be provided between one terminal of the capacitor C1 and the node N1.

Figure 28:
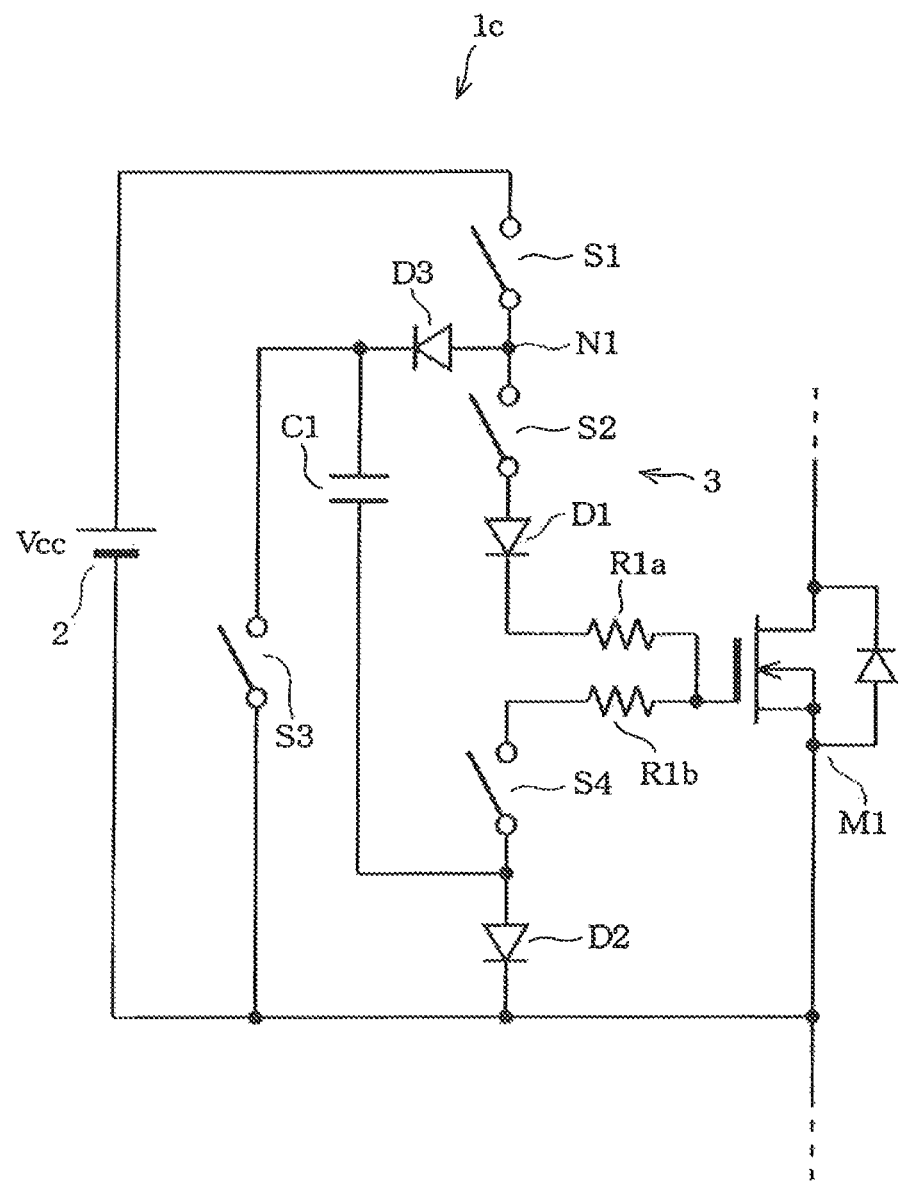
FIG. 28 is a diagram showing an example of a structure of a driving circuit having two gate resistances.

The resistor R1 that is a gate resistor is omissible. Additionally, a structure of separately providing a gate resistor for turning-on and a gate resistor for turning-off may be used. That is, a structure having two resistances R1$a$ and R1$b$ may be used, as in a driving circuit 1$c$ shown in FIG. 28. In this case, the cathode of the diode D1 is coupled to the gate of the semiconductor device M1 via the resistor R1$a$ that is the gate resistor for turning-on. One terminal of the switch S4 is coupled to the gate of the semiconductor device M1 via the resistor R1$b$ that is the gate resistor for turning-off. The same modifications are possible also when the negative driving power supply 12 is used. However, in that case, the relation between the turning-on and turning-off is reversed.

Figure 29:
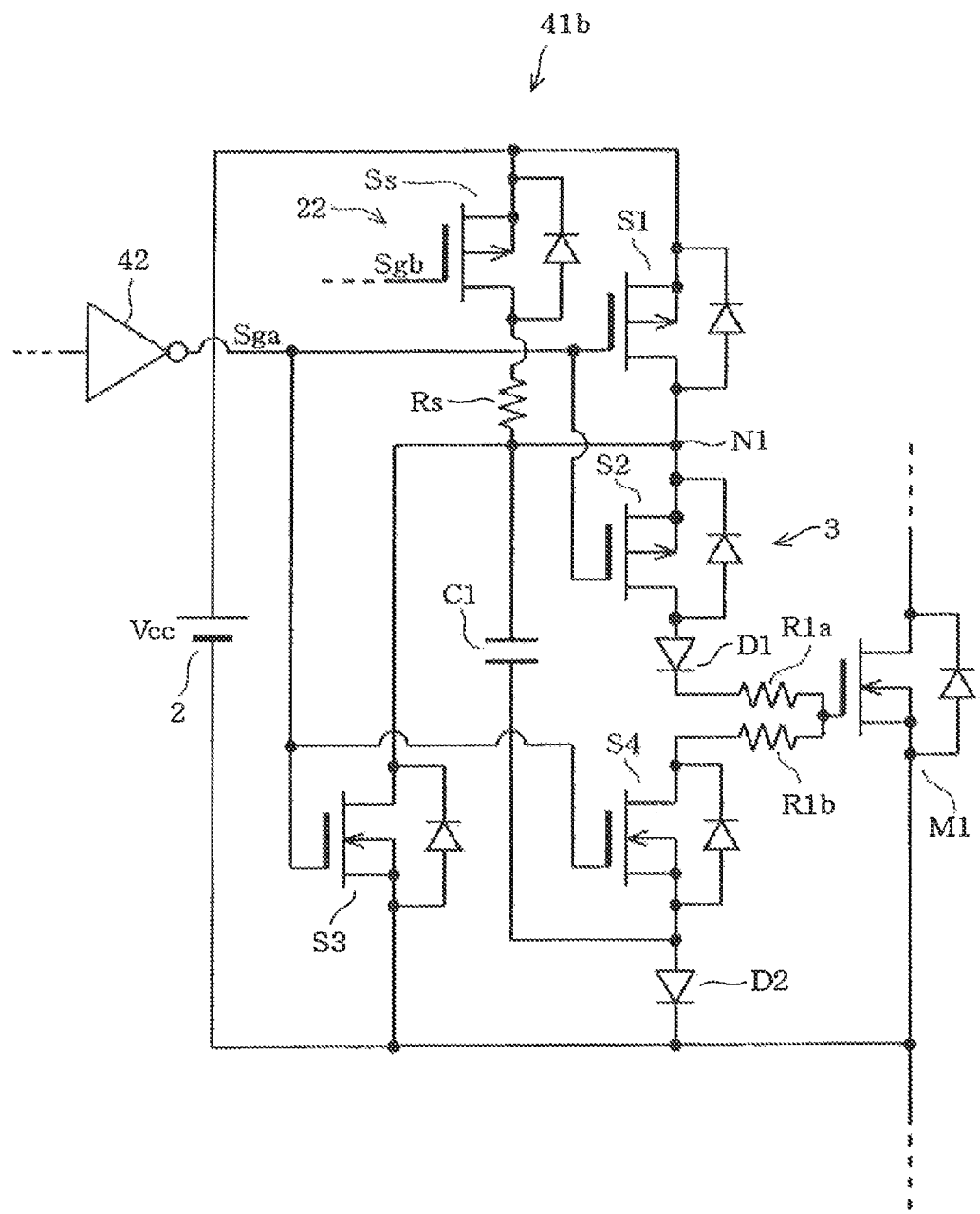
FIG. 29 is a diagram showing another example of the structure of the driving circuit having two gate resistances.

FIG. 29 shows an example of a concrete structure of providing two gate resistances. A driving circuit 41$b$ shown in FIG. 29 is modified by separately providing the gate resistor R1$a$ for turning-on and the gate resistor R1$b$ for turning-off to the driving circuit 41 shown in FIG. 10. In this case, the cathode of the diode D1 is coupled to the gate of the semiconductor device M1 via the resistor R1$a$. The drain of the switch S4 is coupled to the gate of the semiconductor device M1 via the resistor R1$b$.

The driving circuit of the present disclosure is not limited to a power MOSFET using a GaN-HEMT, but can be used for application of driving various power semiconductor devices including other voltage drive type semiconductor devices such as an IGBT and an Si-MOSFET and current drive type semiconductor devices such as a BJT and a Gate Turn-Off thyristor (GTO). When a BJT or IGBT is driven, its base or gate corresponds to a control terminal and its emitter corresponds to one current opening-and-closing terminal. When a GTO is driven, its gate corresponds to a control terminal, and its cathode corresponds to one current opening-and-closing terminal.

When the GTO is driven, it is not necessary to apply the positive voltage (Vcc) to the gate continuously in order to make a forward current flow after the turning-on of the semiconductor device M1. After the turning-off of the semiconductor device M1, it is not necessary to apply the negative voltage (−Vcc) to the gate continuously in order to make a reverse current flow. Therefore, in the period A, after a relatively short time of the first state (switches S1, S2: on, switches S3, S4: off), the switches S1 to S4 each may be switched to provide zero voltage (0 V) to the gate of the semiconductor device M1. Additionally, even after the second state continues only for a relatively short time in the period B (switches S1, S2: off, the switches S3, S4: on), each of the switches S1 to S4 may be switched to apply zero voltage to the gate of the semiconductor device M1. In such a way, power consumption by the driving circuit after the semiconductor device M1 is turned on or turned off can be reduced.

In the structure having the switch S2, the switch S2 and the switch S3 are opened (turned off) and the switch S4 is closed (turned on), so that zero voltage can be provided to the gate of the semiconductor device M1. In this case, the switch S1 may be closed (turned on) or opened (turned off). Alternatively, when the switch S1 and the switch S3 are opened (turned off) and the fifth semiconductor device includes the semiconductor switch (S5), zero voltage can be provided to the gate of the semiconductor device M1 by closing (turning on) the switch S4 after the semiconductor switch (S5) is opened (turned off). Then, the state in which each switch S1 to S4 has been switched corresponds to the third state. However, when the sixth semiconductor device includes the semiconductor switch (S6), the semiconductor switch (S6) is closed in the third state (turned on).

Additionally, the switches S2 and S3 are closed (turned on) and the switches S1 and S4 are opened (turned off), so that zero voltage can be provided to the gate of the semiconductor device M1. Then, the state in which each switch S1 to S4 has been switched in such a way corresponds to a fourth state.

However, when the fifth semiconductor device includes the semiconductor switch (S5), the semiconductor switch (S5) is closed (turned on) in the fourth state. Additionally, when the sixth semiconductor device includes the semiconductor switch (S6), the semiconductor switch (S6) is opened (turned off) in the fourth state.

The startup circuit 22 may be omitted from the structure of the fifth embodiment, and the startup circuit 22 may be added to the structure of the seventh embodiment. Additionally, the startup circuit 22 may be omitted from the structure of the sixth embodiment, and the startup circuit 22 may be added to the structure of the eighth embodiment.

As mentioned in the third embodiment, immediately after the turning-off of the semiconductor device M1, it is necessary to apply a negative voltage to the gate of the semiconductor device M1 to prevent malfunction by a switching noise. However, after generation of a switching noise is settled, a negative voltage may not need to be necessarily applied to the gate. Therefore, the state in which opening and closing of each switch is switched to apply a negative voltage to the gate of the semiconductor device M1 (the second state) may be at least provided in a period behind and adjacent to the state in which opening and closing of each switch is switched to apply a positive voltage to the gate of the semiconductor device M1 (the first state). In this case, the remaining period in one cycle in which a voltage waveform is applied to the gate of the semiconductor device M1 may be the state in which opening and closing of each switch is switched to apply zero voltage to the semiconductor device M1 (the third state or the fourth state). Additionally, the startup operation may be performed in the above remaining periods.

Figure 30:
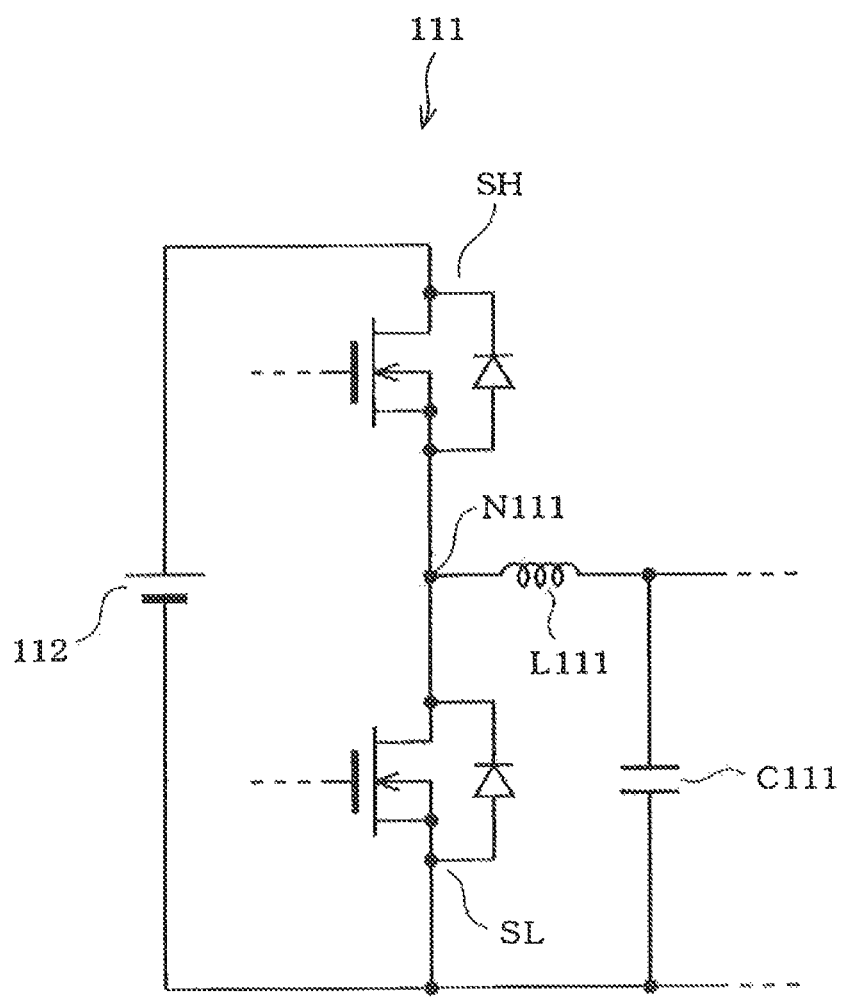
FIG. 30 is a diagram showing one example of a structure of a synchronous rectification chopper.

Additionally, when the semiconductor device M1 to be driven is a switch used for a synchronous rectification chopper, the second state may be provided also in the period ahead of and adjacent to the first state. Hereafter, the reason is explained. FIG. 30 shows one structural example of a synchronous rectification chopper. As shown in FIG. 30, a synchronous rectification chopper 111 (corresponding to a power conversion circuit) includes a high side switch SH and a low side switch SL coupled to one another in series between the output terminals of a DC power supply 112. Between an interconnection node N111 of the switches SH and SL and the low voltage side output terminal of the DC power supply 112, a serial circuit of an inductor L111 and capacitor C111 is coupled. In such a structure, at least one of the switches SH and SL is driven by the driving circuit of each above embodiment.

Figure 31:
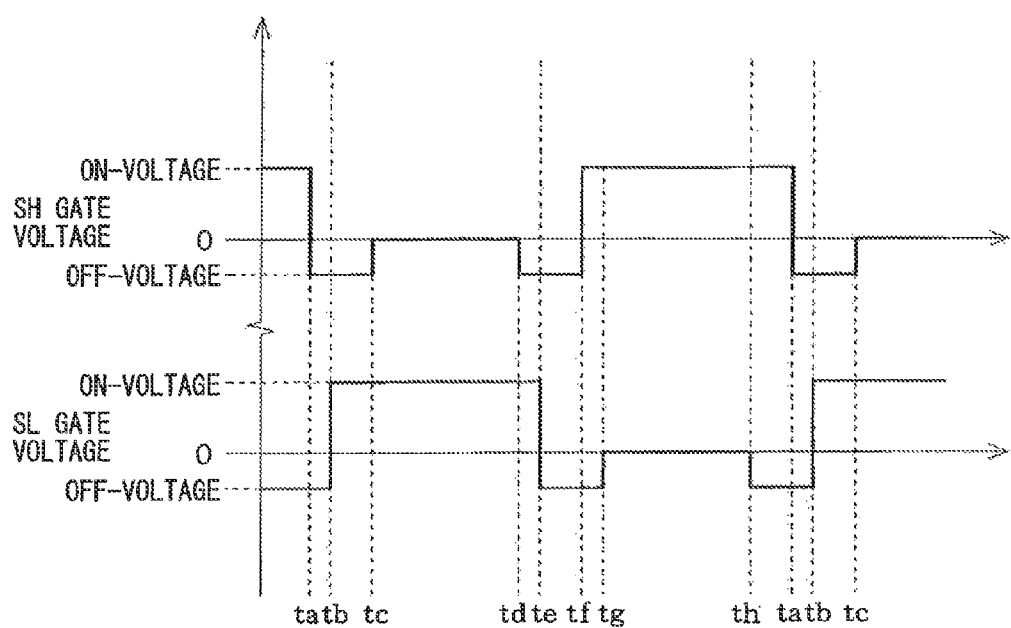
FIG. 31 is a diagram showing operation timing of the synchronous rectification chopper.

As shown in a timing chart of FIG. 31, in the synchronous rectification chopper 111, the high side switch SH and low side switch SL are driven alternately. However, to prevent occurrence of a short state in which the switches SH and SL are both turned on, a short dead time is provided (a period from a time ta to a time tb and a period from a time te to a time tf). Therefore, just before one switch is turned on, the other switch is turned off. Therefore, superimposition of a switching noise due to the other switch may cause malfunction. Then, as mentioned above, when the second state is provided in the period behind and adjacent to the first state and additionally in the period ahead of and adjacent to the first state, occurrence of malfunction due to such a switching noise can be restricted preferably. It is noted that, also in this case, the remaining period in one cycle in which a voltage waveform is applied to the gate of the semiconductor M1 may be the state in which opening and closing of each switch is switched to apply zero voltage to the gate of the semiconductor M1 (the third state or fourth state). The startup operation may be performed in the above remaining period.

Additionally, in each above embodiment, any device of the first to sixth semiconductor devices may be structured to be changed between a P channel type and an N channel type while a polarity of a parasitic body diode is arranged not to be changed. However, in this case, it is necessary to input a signal adjusted to an appropriate voltage potential level into the gate of a changed device.

Figure 32A:
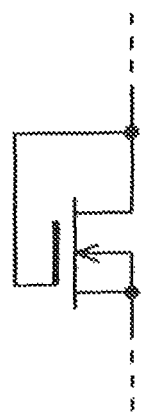
FIG. 32A-32D are diagrams showing examples of a diode-connected transistor.
Figure 32B:
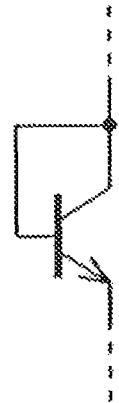
Figure 32C:
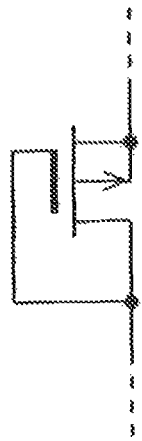
Figure 32D:
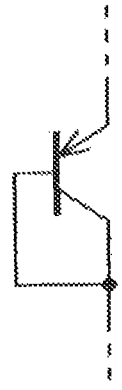

The diodes D1 to D3 can be also structured by a diode-connection of a MOSFET and a bipolar transistor. For example, as shown in FIG. 32A, by connecting the drain and gate of an N channel MOSFET, the drain and source thereof function in the same manner as the anode and cathode of a diode. As shown in FIG. 32B, by connecting the collector and base of an NPN bipolar transistor, the collector and emitter thereof function in the same manner as the anode and cathode of a diode. Additionally, as shown in FIG. 32C, by connecting the gate and drain of a P channel MOSFET, the source and drain thereof function in the same manner as the anode and cathode of a diode. Additionally, as shown in FIG. 32D, by connecting the base and collector of a PNP bipolar transistor, the emitter and collector thereof function in the same manner as the anode and cathode of a diode. However, in the structures of the diode-connection of the MOSFETs shown in FIGS. 32A and 32C, it is necessary to couple a well to an appropriate potential not to generate a parasitic body diode.

When a driving circuit is integrated, no body diode parasitizes the switches S1 to S6 formed of MOSFETs only when a potential of the well in which the device is structured is floated (not coupled to a fixed potential). In such a case, the switches S1 to S6 may be coupled by replacing the source and the drain thereof.

What is claimed is:

1. A driving circuit to drive a semiconductor device that opens and closes a current by applying a voltage directly or indirectly supplied from a driving power supply to a control terminal of the semiconductor device, the driving circuit comprising:
    a first semiconductor device that is a semiconductor switch having a function to open and close at least a current in one direction;
    a second semiconductor device including a semiconductor switch having a function to open and close at least a current in one direction or including a rectifying device;
    a third semiconductor device that is a semiconductor switch having a function to open and close at least a current in one direction;
    a fourth semiconductor device that is a semiconductor switch having a function to open and close at least a current in one direction;
    a fifth semiconductor device including a semiconductor switch having a function to open and close at least a current in one direction or including a rectifying device;
    a sixth semiconductor device including a semiconductor device having a function to open and close a current in one direction or including a rectifying device; and
    an electricity storage portion having an electricity storage function, wherein
    one output terminal of the driving power supply is coupled to one current opening-and-closing terminal of the semiconductor device,
    the first semiconductor device is coupled to be disposed between an other output terminal of the driving power supply and an intermediate node,
    the fifth semiconductor device is coupled to be disposed between one terminal of the electricity storage portion and the intermediate node, the second semiconductor device is coupled to be disposed between the control terminal and the intermediate node, the third semiconductor device is coupled to be disposed between the one output terminal of the driving power supply and the one terminal of the electricity storage portion, the fourth semiconductor device is coupled to be disposed between an other terminal of the electricity storage portion and the control terminal, the sixth semiconductor device is coupled to be disposed between the other terminal of the electricity storage portion and the one output terminal of the driving power supply, a first state and a second state are provided in one cycle in which a voltage is applied to the semiconductor device, in the first state, the first semiconductor device is closed, the third semiconductor device and the fourth semiconductor device are opened, and when the second semiconductor device includes the semiconductor switch, the semiconductor switch is closed, and in the second state, the first semiconductor device is opened, and the third semiconductor device and the fourth semiconductor device are closed.

2. The driving circuit according to claim 1, wherein one of or both of the fifth semiconductor device and the sixth semiconductor device include a rectifying device, and the rectifying device is provided to prevent a discharge current flowing through a path that shorts both terminals of the electricity storage portion when the fourth semiconductor device or the third semiconductor device is closed.

3. The driving circuit according to claim 1, wherein one of or both of the fifth semiconductor device and the sixth semiconductor device include a semiconductor switch, and the semiconductor switch is closed in the first state and is opened in the second state.

4. The driving circuit according to claim 1, wherein the electricity storage portion is a capacitor.

5. The driving circuit according to claim 1, wherein the electricity storage portion includes a plurality of capacitors and a topology switching portion to switch between a serial coupling to couple the capacitors to each other in series and a parallel coupling to couple the capacitors in parallel to each other, and the topology switching portion switches connection topologies of the capacitors so that the connection topology of the capacitors in the first state and the connection topology of the capacitors in the second state are different from one another.

6. The driving circuit according to claim 1, wherein the one cycle in which a voltage waveform is applied to the control terminal of the semiconductor device consists of the first state and the second state.

7. The driving circuit according to claim 1, wherein the one cycle in which a voltage waveform is applied to the control terminal of the semiconductor device further includes one of or both of the third state and the fourth state, the third state is a state in which, in addition to execution of one of the followings:
when the second semiconductor device includes the semiconductor switch, the semiconductor switch is opened; and
the first semiconductor device is opened and, when the fifth semiconductor device includes a semiconductor switch, the semiconductor switch is opened, the third semiconductor device is opened and the fourth semiconductor device is closed and, when the sixth semiconductor device includes a semiconductor switch, the semiconductor switch is closed, and the fourth state is a state in which:
when the second semiconductor device includes a semiconductor switch, the semiconductor switch is closed;
when the fifth semiconductor device includes the semiconductor switch, the semiconductor switch is closed, and the third semiconductor device is closed; and
the first semiconductor device is opened, and when the fourth semiconductor device or the sixth semiconductor device includes the semiconductor switch, the semiconductor switch is opened.

8. The driving circuit according to claim 1, wherein the second semiconductor device includes the semiconductor switch having the function to open and close at least a current in one direction, both ends of the fifth semiconductor device are shorted, and the fifth semiconductor device is omitted.

9. The driving circuit according to claim 1, wherein the second semiconductor device has the rectification function to pass a current in one direction and to prevent a current in another direction.

10. The driving circuit according to claim 1, wherein both ends of the second semiconductor device are shorted, and the second semiconductor device is omitted.

11. The driving circuit according to claim 1, wherein when the third semiconductor device and the fourth semiconductor device are closed to transition to the second state, the third semiconductor device is closed before the fourth semiconductor device is closed.

12. The driving circuit according to claim 10, wherein the other output terminal of the driving power supply is a high potential side output terminal, the first semiconductor device is a P channel MOSFET and has a terminal of a source on a side of the other output terminal of the driving power supply, the third semiconductor device is an N channel MOSFET and has a terminal of a drain on a side of the one output terminal of the electricity storage portion, the fourth semiconductor device is an N channel MOSFET and has a terminal of a drain on a side of the control terminal, the fifth semiconductor device is a diode and has a terminal of an anode on a side of the intermediate node, and the sixth semiconductor device is a diode and has a terminal of an anode on a side of the other terminal of the electricity storage portion.

13. The driving circuit according to claim 10, wherein the other output terminal of the driving power supply is a high potential side output terminal, the first semiconductor device is a P channel MOSFET and has a terminal of a source on a side of the other output terminal of the driving power supply, the third semiconductor device is an N channel MOSFET and has a terminal of a drain on a side of the one output terminal of the electricity storage portion, the fourth semiconductor device is an N channel MOSFET and has a terminal of a drain on a side of the control terminal, the fifth semiconductor device is a P channel MOSFET and has a terminal of a drain on a side of the intermediate node, or is an N channel MOSFET and has a terminal of a source on a side of the intermediate node, and the sixth semiconductor device is an N channel MOSFET and has a terminal of a source on a side of the other terminal of the electricity storage portion, or is a P channel MOSFET and has a terminal of a drain on a side of the other terminal of the electricity storage portion.

14. The driving circuit according to claim 1, wherein the one cycle in which the voltage waveform is applied to the control terminal of the semiconductor device further includes a third state, the third state is a state in which, in addition to execution of one of the followings:

when the second semiconductor device includes the semiconductor switch, the semiconductor switch is opened; and the first semiconductor device is opened, and when the fifth semiconductor device includes the semiconductor switch, the semiconductor switch is opened, the third semiconductor device is opened, and the fourth semiconductor device is closed, and when the sixth semiconductor device includes the semiconductor switch, the semiconductor switch is closed, and the second state is provided behind and adjacent to the first state, and the third state is provided in a period after the second state continues for a predetermined time.

15. The driving circuit according to claim 1, wherein the second state is provided in a period ahead of and adjacent to the first state.

* * * * *